US009793717B2

(12) United States Patent
White, II et al.

(10) Patent No.: US 9,793,717 B2
(45) Date of Patent: Oct. 17, 2017

(54) APPARATUS AND METHOD FOR NON-COMPLIANT OBJECT DETECTION

(71) Applicant: QUALCOMM Incorporated, San Diego, CA (US)

(72) Inventors: Mark D. White, II, San Diego, CA (US); Edward Kenneth Kallal, San Diego, CA (US); Ryan Tseng, Coronado, CA (US); Joseph N. Maalouf, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 214 days.

(21) Appl. No.: 14/335,655

(22) Filed: Jul. 18, 2014

(65) Prior Publication Data
US 2015/0054453 A1    Feb. 26, 2015

Related U.S. Application Data

(60) Provisional application No. 61/883,920, filed on Sep. 27, 2013, provisional application No. 61/869,488, filed on Aug. 23, 2013.

(51) Int. Cl.
*H02J 5/00* (2016.01)
*G01R 29/08* (2006.01)
(Continued)

(52) U.S. Cl.
CPC .............. *H02J 5/005* (2013.01); *G01R 21/01* (2013.01); *G01R 29/0814* (2013.01); *G01V 3/12* (2013.01);
(Continued)

(58) Field of Classification Search
CPC ...................................... H02J 5/005
(Continued)

(56) References Cited

U.S. PATENT DOCUMENTS 8,766,487 B2 * 7/2014 Dibben ................... H02J 5/005
307/104
8,957,549 B2 * 2/2015 Kesler ...................... H03H 7/40
307/104
(Continued)

FOREIGN PATENT DOCUMENTS

| JP | 2012244732 A | 12/2012 |
|---|---|---|
| WO | WO-2012127335 A1 | 9/2012 |
| WO | WO-2013088238 A2 | 6/2013 |

OTHER PUBLICATIONS

International Search Report and Written Opinion—PCT/US2014/050384—ISA/EPO—Nov. 11, 2014.
(Continued)

*Primary Examiner* — Drew A Dunn
*Assistant Examiner* — Jerry D Robbins
(74) *Attorney, Agent, or Firm* — Knobbe, Martens, Olson & Bear, LLP

(57) ABSTRACT

An apparatus and method for lost power detection are described. In one implementation, an apparatus for wireless transferring power comprises a wireless power transmitter configured to wirelessly transmit power at a power level sufficient to power or charge a chargeable device. The apparatus further comprises a controller configured to determine a first and second power difference between a first and second power measurement and the second and a third power measurement of the power level provided by the wireless power transmitter at a first, second, and third sample time, respectively. The controller is further configured to determine a transmitter power difference between the first power difference and the second power difference. The controller is further configured to determine an absence or a presence of an object that affects consumption of power
(Continued)

transmitted by the wireless power transmitter based at least on the transmitter power difference $\Delta\_T$.

23 Claims, 8 Drawing Sheets

(51) Int. Cl.
*H02J 7/02* (2016.01)
*G01R 21/01* (2006.01)
*G01V 3/12* (2006.01)
*H04B 5/00* (2006.01)
*H02J 7/00* (2006.01)

(52) U.S. Cl.
CPC ............. *H02J 7/007* (2013.01); *H02J 7/025* (2013.01); *H04B 5/0037* (2013.01); *H04B 5/0075* (2013.01); *H02J 7/0052* (2013.01)

(58) Field of Classification Search
USPC ........................................................ 320/108
See application file for complete search history.

(56) References Cited

U.S. PATENT DOCUMENTS

| | | | | |
|---|---|---|---|---|
| 9,148,201 | B2 * | 9/2015 | Kallal | H02J 5/005 |
| 9,331,526 | B2 * | 5/2016 | Stevens | H02J 5/005 |
| 2007/0228833 | A1 | 10/2007 | Stevens et al. | |
| 2008/0197712 | A1 * | 8/2008 | Jin | H02J 5/005 |
| | | | | 307/104 |
| 2009/0127936 | A1 * | 5/2009 | Kamijo | H02J 7/025 |
| | | | | 307/104 |
| 2010/0070219 | A1 | 3/2010 | Azancot et al. | |
| 2010/0084918 | A1 | 4/2010 | Fells et al. | |
| 2011/0196544 | A1 | 8/2011 | Baarman et al. | |
| 2011/0221388 | A1 | 9/2011 | Low et al. | |
| 2011/0248727 | A1 | 10/2011 | Krumme et al. | |
| 2011/0285214 | A1 | 11/2011 | Stevens et al. | |
| 2012/0068536 | A1 | 3/2012 | Stevens et al. | |
| 2012/0089039 | A1 | 4/2012 | Felix et al. | |
| 2012/0146576 | A1 * | 6/2012 | Partovi | H01F 7/0252 |
| | | | | 320/108 |
| 2012/0212071 | A1 | 8/2012 | Miyabayashi et al. | |
| 2012/0293007 | A1 * | 11/2012 | Byun | H02J 17/00 |
| | | | | 307/104 |
| 2012/0313579 | A1 * | 12/2012 | Matsumoto | H02J 7/025 |
| | | | | 320/108 |
| 2012/0326521 | A1 | 12/2012 | Bauer et al. | |
| 2013/0002038 | A1 | 1/2013 | Lee et al. | |
| 2013/0038402 | A1 | 2/2013 | Karalis et al. | |
| 2013/0076153 | A1 | 3/2013 | Murayama et al. | |
| 2013/0094598 | A1 | 4/2013 | Bastami | |
| 2013/0162220 | A1 | 6/2013 | Iijima et al. | |
| 2013/0200919 | A1 | 8/2013 | Fokkelman et al. | |
| 2013/0257165 | A1 | 10/2013 | Singh | |
| 2013/0257168 | A1 | 10/2013 | Singh | |
| 2013/0285618 | A1 | 10/2013 | Iijima et al. | |
| 2014/0077617 | A1 | 3/2014 | Nakano et al. | |
| 2014/0111019 | A1 * | 4/2014 | Roy | G01V 3/081 |
| | | | | 307/104 |
| 2015/0054352 | A1 | 2/2015 | Kallal et al. | |
| 2015/0054454 | A1 | 2/2015 | White, II et al. | |
| 2016/0036265 | A1 | 2/2016 | Kim et al. | |

OTHER PUBLICATIONS

Kuyvenhoven, N., et al., "Development of a Foreign Object Detection and Analysis Method for Wireless Power Systems," 2011 IEEE Symposium on Product Compliance Engineering (PSES), pp. 1-6.

* cited by examiner

APPARATUS AND METHOD FOR NON-COMPLIANT OBJECT DETECTION

CROSS-REFERENCE TO RELATED APPLICATIONS

This application claims priority to U.S. Provisional Patent Application No. 61/883,920, entitled "APPARATUS AND METHOD FOR LOST POWER DETECTION," and filed Sep. 27, 2013, the entirety of which is incorporated herein by reference. This application also claims priority to U.S. Provisional Patent Application No. 61/869,488, entitled "SYSTEMS, APPARATUS, AND METHODS FOR QUANTIFYING POWER LOSSES DUE TO INDUCTION HEATING IN WIRELESS POWER RECEIVERS," and filed Aug. 23, 2013, the entirety of which is incorporated herein by reference.

TECHNICAL FIELD

The described technology generally relates to wireless power. More specifically, the disclosure is directed to devices, systems, and methods related to detection of non-compliant objects present in a magnetic field.

BACKGROUND

Loosely coupled wireless power systems include a power transfer unit (e.g., a charging device) and one or more power receive units (e.g., a cellphone, a laptop, etc.) to be charged. When non-compliant objects are present within the charging region of the power transfer unit, electrical energy may be lost in the wireless power system. The lost electrical energy may harm a user, damage a device or object, start a fire, etc. As such, it is desirable to detect when the power system experiences a loss in power and to respond appropriately.

SUMMARY

An apparatus for wirelessly transferring power is provided. The apparatus comprises a wireless power transmitter configured to wirelessly transmit power at a power level sufficient to power or charge a chargeable device positioned within a charging region. The apparatus further comprises a controller circuit operationally coupled to the wireless power transmitter and configured to determine a first power difference $\Delta\_1$ (PTU) between a first power measurement $P\_1$(PTU) of the power level provided by the wireless power transmitter at a first sample time $T\_1$ and a second power measurement $P\_2$ (PTU) of the power level provided by the wireless power transmitter at a second sample time $T\_2$. The controller circuit is further configured to determine a second power difference $\Delta\_2$(PTU) between the second power measurement $P\_2$ (PTU) and a third power measurement $P\_3$ (PTU) of the power level provided by the wireless power transmitter at a third sample time $T\_3$. The controller circuit is further configured to determine a transmitter power difference $\Delta\_T$ between the first power difference $\Delta\_1$ (PTU) and the second power difference $\Delta\_2$ (PTU). The controller circuit is further configured to determine an absence or a presence of an object that affects consumption of power transmitted by the wireless power transmitter based at least on the transmitter power difference $\Delta\_T$.

A method for wirelessly transferring power is provided. The method comprises wirelessly transmitting power at a power level sufficient to power or charge a chargeable device positioned within a charging region. The method further comprises determining a first power difference $\Delta\_1$ (PTU) between a first power measurement $P\_1$(PTU) of the power level provided by the wireless power transmitter at a first sample time $T\_1$ and a second power measurement $P\_2$ (PTU) of the power level provided by the wireless power transmitter at a second sample time $T\_2$. The method further comprises determining a second power difference $\Delta\_2$ (PTU) between the second power measurement $P\_2$ (PTU) and a third power measurement $P\_3$ (PTU) of the power level provided by the wireless power transmitter at a third sample time $T\_3$. The method further comprises determining a transmitter power difference $\Delta\_T$ between the first power difference $\Delta\_1$(PTU) and the second power difference $\Delta\_2$ (PTU). The method further comprises determining an absence or a presence of an object that affects consumption of power transmitted by the wireless power transmitter based at least on the transmitter power difference $\Delta\_T$.

An apparatus for wirelessly transferring power is provided. The apparatus comprises means for wirelessly transmitting power at a power level sufficient to power or charge a chargeable device positioned within a charging region. The apparatus further comprises means for determining a first power difference $\Delta\_1$ (PTU) between a first power measurement $P\_1$ (PTU) of the power level provided by the wireless power transmitter at a first sample time $T\_1$ and a second power measurement $P\_2$ (PTU) of the power level provided by the wireless power transmitter at a second sample time $T\_2$. The apparatus further comprises means for determining a second power difference $\Delta\_2$ (PTU) between the second power measurement $P\_2$ (PTU) and a third power measurement $P\_3$(PTU) of the power level provided by the wireless power transmitter at a third sample time $T\_3$. The apparatus further comprises means for determining a transmitter power difference $\Delta\_T$ between the first power difference $\Delta\_1$(PTU) and the second power difference $\Delta\_2$(PTU). The apparatus further comprises means for determining an absence or a presence of an object that affects consumption of power transmitted by the wireless power transmitter based at least on the transmitter power difference $\Delta\_T$.

A non-transitory computer-readable medium is provided. The medium comprises code that, when executed, causes an apparatus to wirelessly transmit power at a power level sufficient to power or charge a chargeable device positioned within a charging region. The medium further comprises code that, when executed, causes an apparatus to determine a first power difference $\Delta_{1(PTU)}$ between a first power measurement $P_{1(PTU)}$ of the power level provided by the wireless power transmitter at a first sample time $T_1$ and a second power measurement $P_{2(PTU)}$ of the power level provided by the wireless power transmitter at a second sample time $T_2$. The medium further comprises code that, when executed, causes an apparatus to determine a second power difference $\Delta_{2(PTU)}$ between the second power measurement $P_{2(PTU)}$ and a third power measurement $P_{3(PTU)}$ of the power level provided by the wireless power transmitter at a third sample time $T_3$. The medium further comprises code that, when executed, causes an apparatus to determine a transmitter power difference $\Delta_T$ between the first power difference $\Delta_{1(PTU)}$ and the second power difference $\Delta_{2(PTU)}$. The medium further comprises code that, when executed, causes an apparatus to determine an absence or a presence of an object that affects consumption of power transmitted by the wireless power transmitter based at least on the transmitter power difference $\Delta_T$.

Figure 1:
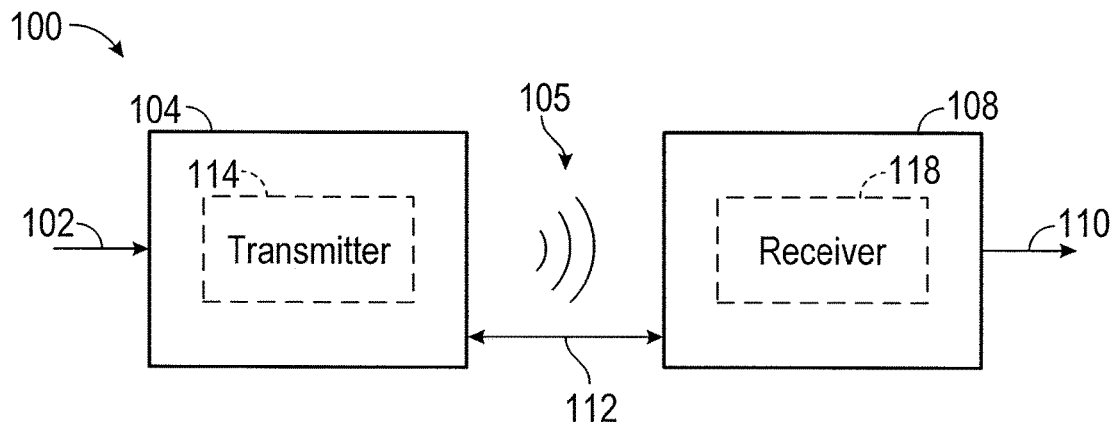
FIG. 1 is a functional block diagram of an exemplary wireless power transfer system, in accordance with exemplary embodiments of the invention.

The various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The detailed description set forth below in connection with the appended drawings is intended as a description of certain implementations of the invention and is not intended to represent the only implementations in which the invention may be practiced. The term "exemplary" used throughout this description means "serving as an example, instance, or illustration," and should not necessarily be construed as preferred or advantageous over other exemplary implementations. The detailed description includes specific details for the purpose of providing a thorough understanding of the disclosed implementations. In some instances, some devices are shown in block diagram form.

Wirelessly transferring power may refer to transferring any form of energy associated with electric fields, magnetic fields, electromagnetic fields, or otherwise from a transmitter to a receiver without the use of physical electrical conductors (e.g., power may be transferred through free space). The power output into a wireless field (e.g., a magnetic field) may be received, captured by, or coupled by a "receiving antenna" (or "receive antenna") to achieve power transfer.

FIG. 1 is a functional block diagram of an exemplary wireless power transfer system 100, which may be a loosely coupled wireless power system, in accordance with exemplary embodiments of the invention. Input power 102 may be provided to a transmitter 104 from a power source (not shown) for generating a field 105 for providing energy transfer. A receiver 108 may couple to the field 105 and generate output power 110 for storing or consumption by a device (not shown) coupled to the output power 110. Both the transmitter 104 and the receiver 108 are separated by a distance 112. In one exemplary embodiment, transmitter 104 and receiver 108 are configured according to a mutual resonant relationship. When the resonant frequency of receiver 108 and the resonant frequency of transmitter 104 are substantially the same or similar, transmission losses between the transmitter 104 and the receiver 108 are minimal. As such, wireless power transfer may be provided over larger distance in contrast to purely inductive solutions that may require large coils that require coils to be very close (e.g., mms). Resonant inductive coupling techniques may thus allow for improved efficiency and power transfer over various distances and with a variety of inductive coil configurations.

The receiver 108 may receive power when the receiver 108 is located in an energy field 105 produced by the transmitter 104. The field 105 corresponds to a region where energy output by the transmitter 104 may be captured by a receiver 108. In some cases, the field 105 may correspond to the "near-field" of the transmitter 104 as further described below. The transmitter 104 may include a transmit antenna 114 for outputting an energy transmission. The receiver 108 further includes a receive antenna 118 for receiving or capturing energy from the energy transmission. The near-field may correspond to a region in which there are strong reactive fields resulting from the currents and charges in the transmit antenna 114 that minimally radiate power away from the transmit antenna 114. In some cases the near-field may correspond to a region that is within about one wavelength (or a fraction thereof) of the transmit antenna 114. The transmit and receive antennas 114 and 118 are sized according to applications and devices to be associated therewith. As described above, efficient energy transfer may occur by coupling a large portion of the energy in a field 105 of the transmit antenna 114 to a receive antenna 118 rather than propagating most of the energy in an electromagnetic wave to the far field. When positioned within the field 105, a "coupling mode" may be developed between the transmit antenna 114 and the receive antenna 118. The area around the transmit and receive antennas 114 and 118 where this coupling may occur is referred to herein as a coupling-mode region. In one embodiment, the transmit antenna 114 and the receive antenna 118 may communicate via a Bluetooth Low Energy (BLE) link.

Figure 2:
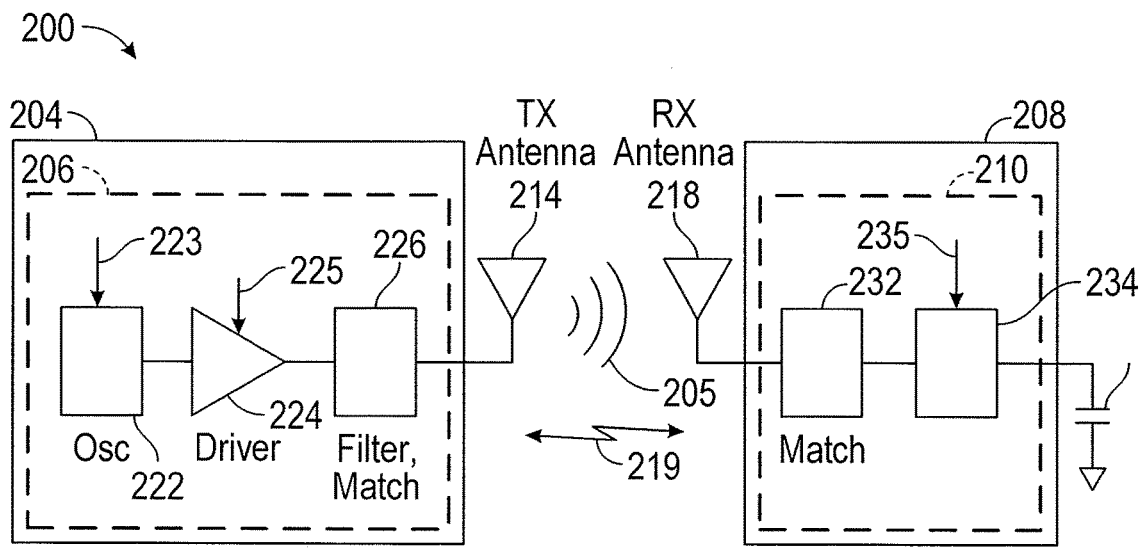
FIG. 2 is a functional block diagram of exemplary components that may be used in the wireless power transfer system of FIG. 1, in accordance with exemplary embodiments of the invention.

FIG. 2 is a functional block diagram of exemplary components that may be used in the wireless power transfer system 100 of FIG. 1, in accordance with exemplary embodiments of the invention. The transmitter 204 may include transmit circuitry 206 that may include an oscillator 222, a driver circuit 224, and a filter and matching circuit 226. The oscillator 222 may be configured to generate a signal at a desired frequency, such as 468.75 KHz, 6.78 MHz or 13.56 MHz, that may be adjusted in response to a frequency control signal 223. The oscillator signal may be provided to a driver circuit 224 configured to drive the transmit antenna 214 at, for example, a resonant frequency of the transmit antenna 214. The driver circuit 224 may be a switching amplifier configured to receive a square wave from the oscillator 222 and output a sine wave. For example, the driver circuit 224 may be a class E amplifier. A filter and matching circuit 226 may be also included to filter out harmonics or other unwanted frequencies and match the impedance of the transmitter 204 to the transmit antenna 214. As a result of driving the transmit antenna 214, the transmitter 204 may wirelessly output power at a level sufficient for charging or power an electronic device. As one example, the power provided may be for example on the order of 300 milliWatts to 20 Watts to power or charge different devices with different power requirements. Higher or lower power levels may also be provided. In one embodiment, the transmit antenna 214 and the receive antenna 218 may communicate via a Bluetooth Low Energy (BLE) link.

The receiver 208 may include receive circuitry 210 that may include a matching circuit 232 and a rectifier and switching circuit 234 to generate a DC power output from an AC power input to charge a battery 236 as shown in FIG. 2 or to power a device (not shown) coupled to the receiver 108. The matching circuit 232 may be included to match the impedance of the receive circuitry 210 to the receive antenna 218. The receiver 208 and the transmitter 204 may additionally communicate on a separate communication channel 219 (e.g., Bluetooth, zigbee, cellular, etc). The receiver 208 and transmitter 204 may alternatively communicate via in-band signaling using characteristics of the wireless field 205.

As described more fully below, the receiver 208, that may initially have a selectively disablable associated load (e.g., the battery 236), may be configured to determine whether an amount of power transmitted by the transmitter 204 and receiver by the receiver 208 is appropriate for charging a battery 236. Further, the receiver 208 may be configured to enable a load (e.g., the battery 236) upon determining that the amount of power is appropriate. In some embodiments, the receiver 208 may be configured to directly utilize power received from a wireless power transfer field without charging of the battery 236. For example, a communication device, such as a near-field communication (NFC) or radio-frequency identification device (RFID) may be configured to receive power from a wireless power transfer field and communicate by interacting with the wireless power transfer field and/or utilize the received power to communicate with the transmitter 204 or other devices.

Figure 3:
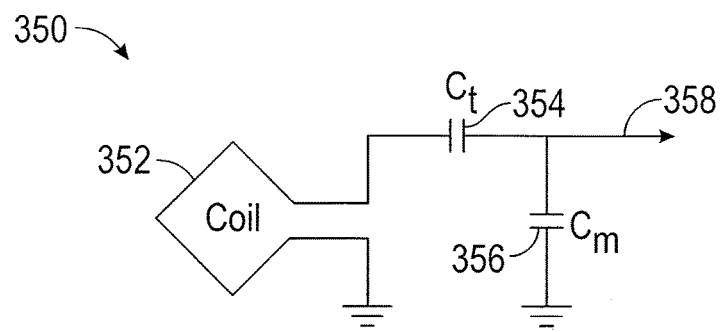
FIG. 3 is a schematic diagram of a portion of transmit circuitry or receive circuitry of FIG. 2 including a transmit or receive antenna, in accordance with exemplary embodiments of the invention.

FIG. 3 is a schematic diagram of a portion of transmit circuitry 206 or receive circuitry 210 of FIG. 2 including a transmit or receive antenna 352, in accordance with exemplary embodiments of the invention. As illustrated in FIG. 3, transmit or receive circuitry 350 used in exemplary embodiments including those described below may include an antenna 352 (or "loop" antenna). The antenna 352 may be configured to include an air core or a physical core such as a ferrite core (not shown). Air core loop antennas may be more tolerable to extraneous physical devices placed in the vicinity of the core. Furthermore, an air core loop antenna 352 allows the placement of other components within the core area. In addition, an air core loop may more readily enable placement of the receive antenna 218 (FIG. 2) within a plane of the transmit antenna 214 (FIG. 2) where the coupled-mode region of the transmit antenna 214 (FIG. 2) may be more powerful. The antenna 352 may be a coil (e.g., an induction coil) and/or an RF antenna, or any other suitable device to wirelessly receive or output power. The antenna 352 may be implemented with a Litz wire or as an antenna strip designed for low resistance. The antenna 352 may not need "turns" to be of a practical dimension. An exemplary implementation of the antenna 352 may be "electrically small" (e.g., a fraction of the wavelength) and tuned to resonate at a usable low frequency by using capacitors to define the resonant frequency.

As stated, efficient transfer of energy between the transmitter 104 and receiver 108 may occur during matched or nearly matched resonance between the transmitter 104 and the receiver 108. However, even when resonance between the transmitter 104 and receiver 108 are not matched, energy may be transferred, although the efficiency may be affected. Transfer of energy occurs by coupling energy from the field 105 of the transmit antenna 214 coil to the receive antenna 218 residing in the neighborhood where this field 105 is established rather than propagating the energy from the transmit antenna 214 into free space.

The resonant frequency of the loop or magnetic antennas is based on the inductance and capacitance. Inductance may be simply the inductance created by the antenna 352, whereas, capacitance may be added to the antenna's inductance to create a resonant structure at a desired resonant frequency. As a non-limiting example, the capacitor 356 and the capacitor 354 may be added to the transmit or receive circuitry 350 to create a resonant circuit that selects a signal 358 at a resonant frequency. Accordingly, for larger diameter antennas, the size of capacitance needed to sustain resonance may decrease as the diameter or inductance of the loop increases. Furthermore, as the diameter of the antenna increases, the efficient energy transfer area of the near-field may increase. Other resonant circuits formed using other components are also possible. As another non-limiting example, a capacitor may be placed in parallel between the two terminals of the antenna 350. For transmit antennas, a signal 358 with a frequency that substantially corresponds to the resonant frequency of the antenna 352 may be an input to the antenna 352.

In one embodiment, the transmitter 104 may be configured to output a time varying magnetic field with a frequency corresponding to the resonant frequency of the transmit antenna 114. When the receiver is within the field 105, the time varying magnetic field may induce a current in the receive antenna 118. As described above, if the receive antenna 118 is configured to be resonant at the frequency of the transmit antenna 114, energy may be efficiently transferred. The AC signal induced in the receive antenna 118 may be rectified as described above to produce a DC signal that may be provided to charge or to power a load.

Figure 4:
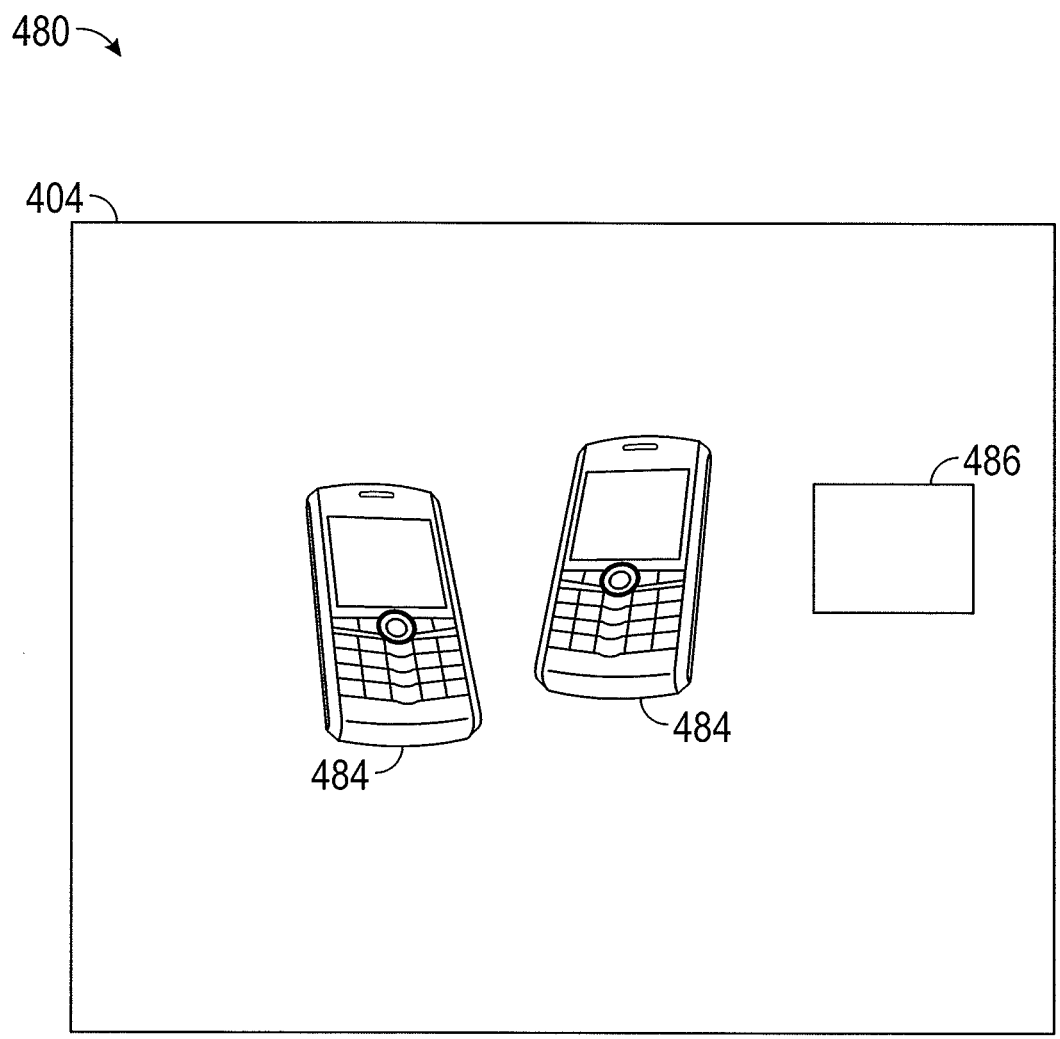
FIG. 4 illustrates a wireless power system including a wireless power transmitter and receivers, in accordance with an exemplary embodiment of the invention.

FIG. 4 illustrates a wireless power system 480 including a power transfer unit "PTU" 404 (e.g., a power transfer unit that provides wireless charging) and one or more power receive units "PRUs" 484 (e.g., power receive units that are wirelessly chargeable devices), according to an exemplary embodiment of the invention. The PTU 404 may create a magnetic field which couples to the PRU 484. The PRU 484 may convert magnetic energy received from the PTU 404 into electrical energy. The PRUs 484 may include devices such as cellular phones, portable music players, computers, laptop computers, tablet computers, computer peripheral devices, communication devices (e.g., Bluetooth headsets), digital cameras, hearing aids (and other medical devices), etc. In one embodiment, the PRU 484 may be connected to a device to be charged which draws on the electrical energy. In another embodiment, the device to be charged may be integrated into the PRU 484. The PRU 484 may be placed on the PTU 404 for the purpose of charging the PRU 484. In one embodiment, the PTU 404 and the PRU 484 may communicate via a Bluetooth Low Energy (BLE) link. The PTU 404 may comprise a wireless power transmitter (e.g., the transmitter 104 of FIG. 1) that may transmit power to the PRU 484 within an associated charging region.

In one embodiment, the wireless power system 480 includes a non-compliant object 486 (or "non-compliant device," "foreign object," or "foreign device"), which may comprise a non-compliant device or component. The non-compliant object 486 may include a damaged device, a device not built to the correct specifications (such as the system specifications of the Alliance for Wireless Power (A4WP)), or any other metal object that couples to the magnetic field (e.g., jewelry, eye-glasses, key-chains, etc.). In one embodiment, the non-compliant object 486 may be any object or device that is unable to communicate with the PTU 404 and function with the system control algorithm, which allows the PTU 404 no method to regulate or detect the electrical energy consumed by the non-compliant object 486. Since the PTU 404 creates a magnetic field, electrical energy may be transferred to any device or object that couples to the PTU 404 magnetic field. The non-compliant object 486 and each of the one or more PRUs 484 may be positioned within a charging region of the PTU 404, which may cause the PRUs 484 to couple to the PTU 404 magnetic field and absorb electrical energy. In this way, the non-compliant object may affect the consumption of power transmitted by the PTU 404 and/or affect the charging region when it is within, near, or around the charging region. The energy absorbed may be dissipated as heat, which may damage the non-compliant object 486, harm or burn the user, cause a fire, damage the PTU 404, or create any other safety issue. Without a non-compliant object or non-compliant device detection system, the PTU 404 may continue to transfer power to the non-compliant object 486 indefinitely.

According to one or more methods, the PTU 404 may be configured to detect one or more of the non-compliant objects 486 affecting an associated charging region. To accomplish this, the PTU 404 may take synchronized power measurements at the PTU 404 and the PRU 484 at scheduled intervals and perform determinations using the measurements, as further described in connection with FIG. 7. Based on the results from these determinations, the PTU 404 may determine a presence or a non-presence of the non-compliant object 486 within, near, or around the charging region. For example, the PTU 404 may determine a difference of power measurement differences taken on both the PTU 404 (e.g., an input power) and the PRU 484 (e.g., an acknowledged power) in two consecutive sampling periods. In the absence of the non-compliant object 486, the difference of power measurement differences at the PTU 404 may be correspondingly reflected at the PRU 484. Similarly, if the PRU 484 changes its power consumption, that may also be correspondingly reflected (e.g., noticed) at the PTU 404 and the PRU 484. The methods of detecting the non-compliant object 486 described in this disclosure are beneficial as compared to previous methods, because unit-unit variances and measurement errors do not slow down or significantly affect the determinations described above. Since the determinations used to determine the presence of the non-compliant object 486 are based on a difference of power measurement differences, any measurement or tolerance errors at the PTU 404 and/or the PRU 484 may cancel out.

If the non-compliant object 486 is present, the PTU 404 may determine that the difference of the power measurement differences at the PTU 404 and the PRU 484 do not correspond (e.g., they do not rise or lower proportionally). For example, if the PTU 404 measures an increase in power, but the PRU 484 does not, then the PTU 404 may determine that the non-compliant object 486 is present (e.g., consuming power). If the PTU 404 determines that the difference of the power measurement differences does not correspond, rather than immediately determining the presence of the non-compliant object 486, the PTU 404 may first compare the result with a dynamically adjusted threshold. The dynamically adjusted threshold may depend on the change in the acknowledged power at the PRU 484, as further described in connection with FIG. 7. As further described in connection with FIG. 7, the PTU 404 may further determine that the non-compliant object 486 is consuming power greater than a specified threshold for a predetermined number of samples (e.g., 10 consecutive samples). In this way, the PTU 404 may determine with high probability whether the non-compliant object 486 is present in the PTU 404 magnetic field. In one embodiment, the PTU 404 may instead determine a cause of the difference of the power measurement differences so as to prevent a false determination of the presence of the non-compliant object 486, as further described in connection with FIG. 8.

In one embodiment, it may be desirable for the power measurements made on the PTU 404 and the PRU 484 to be synchronized (e.g., synchronizing two measurements which each run on independent clocks of the PTU 404 and the PRU 484). As further described in connection with FIG. 8, methods are described to align the independent clock of the PTU 404 with the independent clock of the PRU 484 (e.g., within some tolerance) to keep the power measurements in alignment. In other embodiments, methods may account for (e.g., resolve) a time synchronization difference (e.g., a time latency) between one or more sample times at the PTU 404 and one or more sample times at the PRU 484 by aligning the sample times (e.g., by accounting for the latency in calculations). Having synchronized and aligned these measurements, the PTU 404 may be configured to detect changes in power during each power measurement. For example, the PTU 404 may measure 10 W into its coil (e.g., a resonator of its coil) and the PRU 484 may measure 10 W acknowledged (e.g., consumed) for several consecutive samples. If, in this example, on the next sample, the PTU 404 measures 10.1 W into its coil, the PTU 404 may detect the difference of 0.1 W. If the PRU 484 does not measure the same increase of 0.1 W, the PTU 404 may detect lost power. In one embodiment, if the PTU 404 detects lost power, then the PTU 404 may take additional power measurement samples to determine whether the lost power is due to the presence of the non-compliant object 486 or due to some other cause. In one embodiment, the PTU 404 may determine that the lost power is instead due to a change in the power requirements of the PRU 484 coupled with unsynchronized power measurements at the PTU 404 and the PRU 484, as further described in regards to FIG. 8 below.

Figure 5:
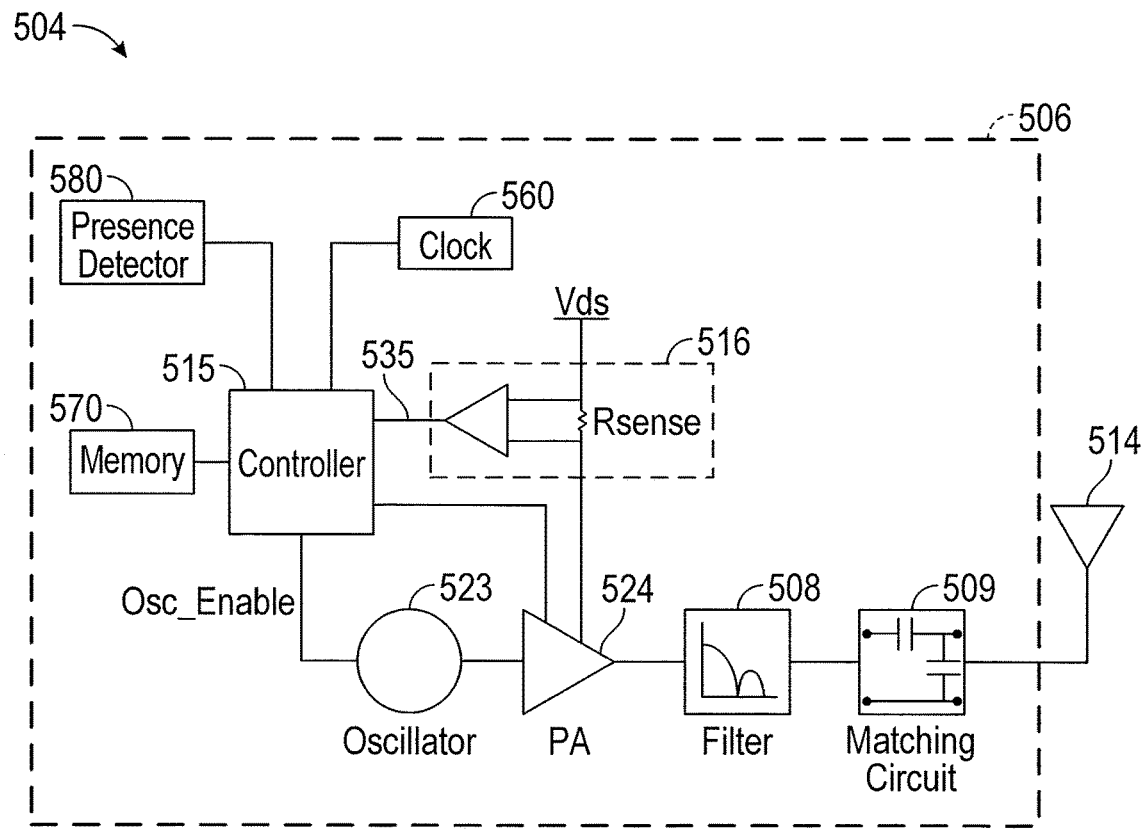
FIG. 5 is a functional block diagram of a transmitter that may be used in the wireless power transfer system of FIG. 1, in accordance with an exemplary embodiment of the invention.

FIG. 5 is a functional block diagram of a PTU 504 (such as the PTU 404) that may be used in the wireless power transfer system of FIG. 1, in accordance with an exemplary embodiment of the invention. Although FIG. 5 shows many different components in functional block forms, an actual physical embodiment may combine one or more functional blocks in a single, unitary component. For example, a clock or a presence detector may be combined with a controller. In another physical embodiment, the components may be included as discrete components. The PTU 504 may receive power through a number of power sources, e.g., an AC-DC converter (not shown) to convert conventional AC power present in a building, a DC-DC converter (not shown) to convert a conventional DC power source to a voltage suitable for the PTU 504, or directly from a conventional DC power source (not shown).

The PTU 504 may comprise a transmit antenna 514 for generating an electromagnetic or magnetic field, hereinafter referred to as a "charging region." The transmit antenna 514 may be a coil (e.g., an induction coil) and/or an RF antenna, or any other suitable device to wirelessly output power. The transmit antenna 514 may be implemented with a Litz wire or as an antenna strip designed for low resistance. In one implementation, the transmit antenna 514 may be associated with a larger structure, such as a table, mat, lamp, or other stationary configuration. Accordingly, the transmit antenna 514 may not need "turns" to be of a practical dimension. An exemplary implementation of the transmit antenna 514 may be "electrically small" (e.g., a fraction of the wavelength) and tuned to resonate at a usable low frequency by using capacitors (e.g., the capacitors 354 and 356 of FIG. 3) to define the resonant frequency. In an exemplary embodiment, the transmit antenna 514 (or another antenna) may transmit power to a receiver device (e.g., the PRU 484) within, near, or around the charging region. In an exemplary embodiment, the transmit antenna 514 (or another antenna) may receive an acknowledgement from the PRU 484 regarding the amount of power it has received, as described in connection with FIG. 4. The transmit antenna 514 (or another antenna) may also receive information from the PRU 484 about the various specifications of the PRU 484, as described below. The transmit antenna 514 (or another antenna) may also receive confirmation from the PRU 484 that the PRU 484 is fully charged. In one embodiment, the transmit antenna 514 (or another antenna) may communicate with the PRU 484 via a Bluetooth Low Energy (BLE) link.

In one exemplary embodiment, the PTU 504 may not remain on indefinitely. This prevents the PTU 504 from running long after the PRUs 484 in its perimeter are fully charged, which may occur if the transmit antenna 514 fails to receive or receives a faulty confirmation from the PRU 484 when it is fully charged. A user may program the PTU 504 to shut off after a desired amount of time. To prevent the PTU 504 from automatically shutting down if another PRU 484 is placed in its perimeter, the PTU 504 may shut off automatically after a set period of lack of motion detected in its perimeter, as described below. The user may be able to set the inactivity time interval and change it as desired. As a non-limiting example, the time interval may be longer than that needed to fully charge the PRU 484 under the assumption that the PRU 484 is initially fully discharged.

The PTU 504 may further comprise transmit circuitry 506. The transmit circuitry 506 may comprise an oscillator 523 for generating oscillating signals (e.g., RF signals). The transmit circuitry 506 may provide RF power to the transmit antenna 514 via the RF signals, resulting in generation of energy (e.g., magnetic flux) about the transmit antenna 514. The PTU 504 may operate at any suitable frequency, e.g., the 6.78 MHz ISM band.

The transmit circuitry 506 may comprise a fixed impedance matching circuit 509 operationally connected to the transmit antenna 514. The fixed impedance matching circuit 509 may match the impedance of the transmit circuitry 506 (e.g., 50 ohms) to the transmit antenna 514. The transmit circuitry 506 may further comprise a low pass filter (LPF) 508 operationally connected to the fixed impedance matching circuit 509. The low pass filter (LPF) 508 may be configured to reduce harmonic emissions to levels that prevent self-jamming of the PRUs 484. Other exemplary embodiments may include different filter topologies, such as notch filters that attenuate specific frequencies while passing others. The transmit circuitry 506 may further comprise a driver circuit 524 operationally connected to the low pass filter (LPF) 508. The driver circuit 524 may be configured to drive the RF signals. Other exemplary embodiments may include an adaptive impedance match that may be varied based on measurable transmit metrics, such as output power to the transmit antenna 514 or DC current to the driver circuit 524. The transmit circuitry 506 may further comprise discrete devices, discrete circuits, and/or an integrated assembly of components. An exemplary RF power output from the transmit antenna 514 may be from 0.3 watts to 20 watts or may also be a higher or lower value.

The transmit circuitry 506 may further comprise a controller 515 operationally connected to the oscillator 523. The transmit circuitry may, in addition to performing other functions, selectively enable the oscillator 523 during transmit phases (or duty cycles) of the PRUs 484. The controller 515 may also adjust the frequency or phase of the oscillator 523. Adjusting the phase of the oscillator 523 and related circuitry in the transmission path may allow for reduction of out-of-band emissions, especially when transitioning from one frequency to another. The controller 515 may also adjust the output power level of the oscillator 523 to implement a communication protocol for interacting with the PRUs 484.

The controller 515 may also perform determinations based on data it sends and receives from other components in the transmit circuitry 506. The transmit circuitry 506 may further comprise a memory 570 operationally connected to the controller 515. The memory 570 may temporarily or permanently store data for use in the determinations of the controller 515. The memory 570 may also store various specifications of the components of the PTU 504 and/or the PRUs 484 for use in determinations as described below.

The controller 515 may gather and track information about the whereabouts and status of the PRUs 484 that may be associated with the PTU 504. Thus, the transmit circuitry 506 may further comprise a presence detector 580 (e.g., a motion detector) operationally connected to the controller 515. The presence detector 580 may detect the initial presence of the PRU 484 to be charged when the PRU 484 enters the vicinity of the charging region and turn on the PTU 504 in such an event. The presence detector 580 may detect the PRU 484 via the transmit antenna 514 or another appropriate antenna not shown in FIG. 5. The controller 515 may adjust the amount of power going to or from the driver circuit 524 in response to presence signals from the presence detector 580. The transmit antenna 514 may then transfer RF power to the PRU 484.

The transmit circuitry 506 may further comprise a load sensing circuit 516 operationally connected to the controller 515. The load sensing circuit 516 may monitor the current flowing to the driver circuit 524, which may be affected by the presence or absence of the PRUs 484 or a non-compliant device (e.g., the non-compliant object 486 of FIG. 4) in the vicinity of the charging region as detected by the presence detector 580. The controller 515 may also detect load changes on the driver circuit 524 to determine whether to enable the oscillator 523.

The transmit circuitry 506 may further comprise a clock 560 operationally connected to the controller 515. The clock 560 may generate clock signals which enable the controller 515 to synchronize actions performed by the controller 515 and any of the other components of the transmit circuitry 506. In one embodiment, the controller 515 may use the clock signals in conjunction with a flag system to maintain a clock synchronization between the PTU 504 and the PRU 484 or otherwise maintain a synchronization or alignment between sample times at the PTU 504 and the PRU 484, as further described in FIG. 8.

In detecting the presence of the non-compliant object 486 within, near, or around the charging region (e.g., affecting the charging region), the controller 515 may measure an initial amount of the PTU 504 output power, e.g., the amount of power the PTU 504 measures into its coil, a level of DC power measured into the PTU 504 power amplifier, and/or a level of AC power measured out of the PTU 504 power amplifier, etc. For use in taking these measurements, the controller 515 may determine sample periods based on the clock signals described above. As further described in connection with FIG. 7, the controller 515 may take these power measurements at a sample time during each sample period and compare the power measurements. For example, the controller 515 may take this power measurement at a first sample time. The controller 515 may then take a second power measurement at a second sample time and determine a power difference between the power measurements at each sample time. In one embodiment, if the power difference at the PTU 504 exceeds a predetermined threshold, then the controller 515 may compare the power difference with a power difference independently generated by the PRU 484, as further described in connection with FIG. 6.

Based on the results of the above comparison (e.g., if the difference of the PRU power differences is greater than the difference of the PTU power differences multiplied by a proportional factor value, k), in one embodiment, the controller 515 may determine that the non-compliant object 486 is present, as further described in connection with FIG. 7. In another embodiment, rather than immediately determining the presence of the non-compliant object 486, the controller 515 may first identify other possible contributors to the power inequalities. By identifying other possible contributors to the power inequalities, the controller 515 may avoid making a false determination that the non-compliant object 486 is present. For example, one possible contributor to the power inequalities may be a change in the acknowledged power at the PRU 484 coupled with a lack of synchronization (e.g., a time misalignment) between measurements taken at the PTU 504 and the PRU 484. In one embodiment, the lack of synchronization between measurements may occur due to the clock 560 being out-of-sync with a clock of the PRU 484 (as further described in connection with FIG. 6). In that case, the controller 515 may utilize a system of flag exchanges to resynchronize the clocks (e.g., within some predetermined tolerance level), as further described in connection with FIG. 8. In another embodiment, the measurements at the PTU 504 and the PRU 484 may be out-of-sync for a different reason, and the controller 515 may use another method to align the measurement sample times (e.g., account for a difference of synchronization between the PTU 504 sample times and the PRU 484 sample times).

Figure 6:
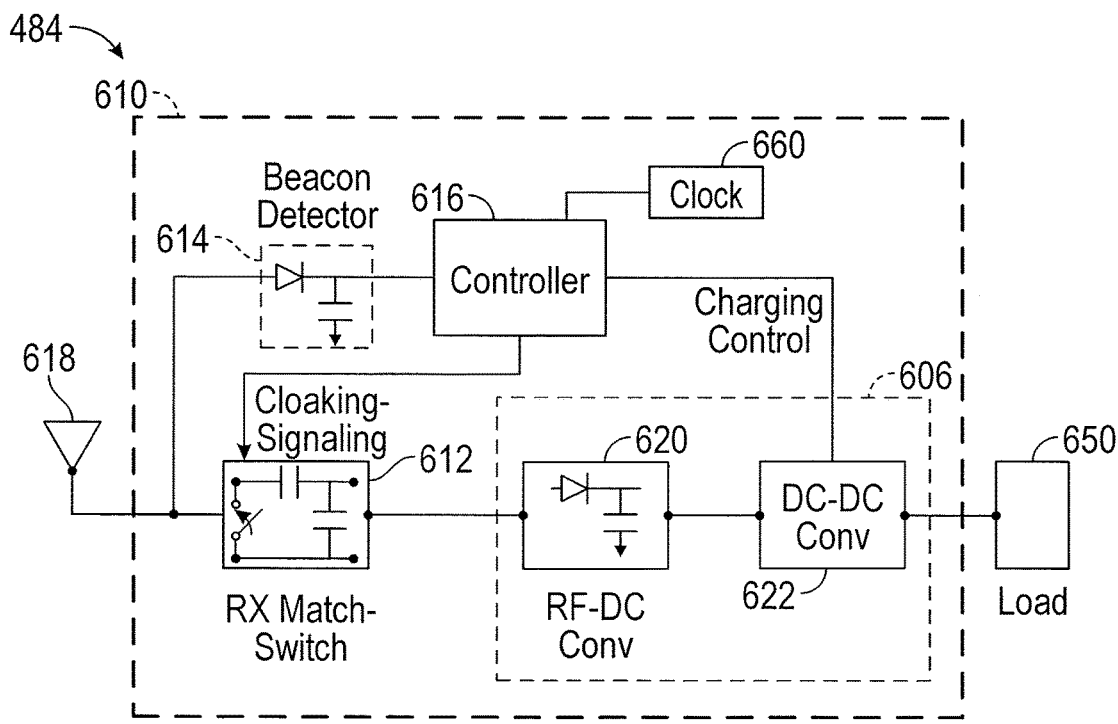
FIG. 6 is a functional block diagram of a receiver that may be used in the wireless power transfer system of FIG. 1, in accordance with an exemplary embodiment of the invention.

FIG. 6 is a functional block diagram of the PRU 484 (as in FIG. 4) that may be used in the wireless power transfer system of FIG. 1, in accordance with an exemplary embodiment of the invention. Although FIG. 6 shows many different components in functional block forms, an actual physical embodiment may combine one or more functional blocks in a single, unitary component. For example, a clock or a beacon detector may be combined with a controller. In another physical embodiment, the components may be included as discrete components.

The PRU 484 may comprise receive circuitry 610 comprising the various components of the PRU 484. The receive circuitry 610 may comprise a receive antenna 618 for receiving power from a transmit antenna (e.g., the transmit antenna 514 of FIG. 5). The PRU 484 may further couple to a load 650 for providing received power thereto. The load 650 may be external to the PRU 484, or the load 650 may be integrated into the PRU 484 (not shown). The receive circuitry 610 may further comprise a controller 616 for coordinating the processes of the PRU 484, as described below.

The receive antenna 618 may be tuned to resonate at a similar frequency, or within a specified range of frequencies, as the transmit antenna 514 (FIG. 5). The receive antenna 618 may be similarly dimensioned with the transmit antenna 514 or it may be differently sized based on the dimensions of the load 650. In one embodiment, the receive antenna 618 may communicate with the transmit antenna 514 (e.g., via a Bluetooth Low Energy (BLE) link). This communication may allow the PRU 484 to send feedback data to the PTU 504, which may allow the PTU 504 to vary the strength of its magnetic field to adjust the electrical energy being transferred to the PRU 484. If the load 650 comprises a diametric or length dimension smaller than the diameter of length of the transmit antenna 514, then the receive antenna 618 may be implemented as a multi-turn coil to reduce the capacitance value of a tuning capacitor (not shown) and increase the receive coil's impedance. For example, the receive antenna 618 may be placed around the substantial circumference of the load 650 in order to maximize the antenna diameter and reduce the number of loop turns (e.g., windings) of the receive antenna 618 and the inter-winding capacitance.

To transmit power to the load 650, the energy from the transmit antenna 514 may be propagated wirelessly to the receive antenna 618 and then coupled through the rest of the receive circuitry 610 to the load 650. For more efficient power transfer, the receive circuitry 610 may provide an impedance match to the receive antenna 618. To help accomplish this, the receive circuitry 610 may comprise a power conversion circuitry 606 operationally connected to the load 650. The power conversion circuitry 606 may convert a received RF energy source into charging power for use by the load 650.

The power conversion circuitry 606 may comprise an RF-to-DC converter 620 to rectify the RF energy signal received at the receive antenna 618 into a non-alternating power with an output voltage. The RF-to-DC converter 620 may be a partial or full rectifier, a regulator, a bridge, a doubler, a linear or switching converter, etc. The power conversion circuitry 606 may further comprise a DC-to-DC converter 622 (or other power regulator) operationally connected to the RF-to-DC converter 620. The DC-to-DC converter 622 may convert the rectified RF energy signal into an energy potential (e.g., voltage) that is compatible with the load 650.

The receive circuitry 610 may further comprise a switching circuitry 612 operationally connected to the power conversion circuitry 606. The switching circuitry 612 may connect or disconnect the receive antenna 618 to or from the power conversion circuitry 606. Disconnecting the receive antenna 618 from the power conversion circuitry 606 may suspend charging of the load 650 and/or change the "load" 650 as "seen" by the PTU 504.

When multiple PRUs 484 are present in the PTU 504 charging field, the controller 616 may be configured to time-multiplex (e.g., switch) the loading and unloading of one or more PRUs 484 to enable other PRUs 484 to more efficiently couple to the PTU 504. Unloading of the PRU 484 (hereinafter referred to as "cloaking" or "cloaked") may eliminate coupling to other nearby PRUs 484 or reduce loading on nearby PTUs 504. Cloaking may also occur upon the occurrence of other events, e.g., detection of an external wired charging source (e.g., wall/USB power) providing charging power to the load 650. The switching between unloading and loading may be detected by the PTU 504. Therefore, the switching between unloading and loading may be performed at a particular speed to function as a protocol that enables the sending of a message from the PRU 484 to the PTU 504. By way of example, the switching speed may be on the order of 100 μsec. Using this switching technique, the PRU 484 may be configured to send various specifications about the PRU 484 to the PTU 504, e.g., specifications that enable the PTU 504 and the PRU 484 to synchronize their clocks and/or exchange power measurement information.

In an exemplary embodiment, communication between the PTU 504 and the PRU 484 refers to a device sensing and charging control mechanism, rather than conventional two-way communication (e.g., in band signaling using the coupling field). In other words, the PTU 504 may use on/off keying of the transmitted signal to adjust whether energy is available in the near-field. The PRU 484 may interpret these changes in energy as a message from the PTU 504. From the receiver side, the PRU 484 may use tuning and de-tuning of the receive antenna 618 to adjust how much power is being accepted from the field. In some cases, the tuning and de-tuning may be accomplished via the switching circuitry 612. The PTU 504 may detect this difference in power used from the field and interpret these changes as a message from the PRU 484. Other forms of modulation of the transmit power and the load 650 behavior may be utilized.

The receive circuitry 610 may further comprise a signaling and beacon detector circuitry 614 operationally connected to the switching circuitry 612. The signaling and beacon detector circuitry 614 may identify received energy fluctuations that may be informational signaling from the PTU 504 to the PRU 484. The controller 616 may monitor the signaling and beacon detector circuitry to determine a beacon state and extract messages sent from the PTU 504. Furthermore, the signaling and beacon detector circuitry 614 may be used to detect the transmission of a reduced RF signal energy (e.g., a beacon signal). The signaling and beacon detector circuitry 604 may further rectify the reduced RF signal energy into a nominal power for awakening either un-powered or power-depleted circuits within receive circuitry 610 in order to configure receive circuitry 610 for wireless charging.

The receive circuitry 610 may further comprise a clock 660 operationally connected to the controller 616. The clock 660 may generate clock signals which enable the controller 616 to synchronize actions performed by the controller 616 and any of the other components of the receive circuitry 610. In one embodiment, the controller 616 may use the clock signals in conjunction with a system of flag exchanges to maintain a clock or sample time synchronization between the PTU 504 and the PRU 484, as mentioned above and as further described in connection with FIG. 8.

As described above in regards to FIG. 5, the PRU 484 may assist the PTU 504 in detecting a presence of a non-compliant object (e.g., the non-compliant object 486 described in relation to FIG. 4) within, near, or around the charging region (as described in regards to FIG. 5). To accomplish this, the controller 616 may measure an initial amount of power the PRU 484 may be receiving from the PTU 504, e.g., the amount of power the PRU 484 acknowledges. The controller 616 may take this power measurement at a first sample time, which the controller 616 may determine based on the clock signals described above in connection with the clock 660. The controller 616 may then take a second power measurement at a second sample time and determine a power difference value between the power measurements at each sample time. In one embodiment, if the PRU 484 receives a request from the PTU 504, then the controller 616 may send the power difference value to the PTU 504 so that the PTU 504 may compare the power difference with a power difference independently generated by the PTU 504, as further described in connection with FIG. 7.

Figure 7:
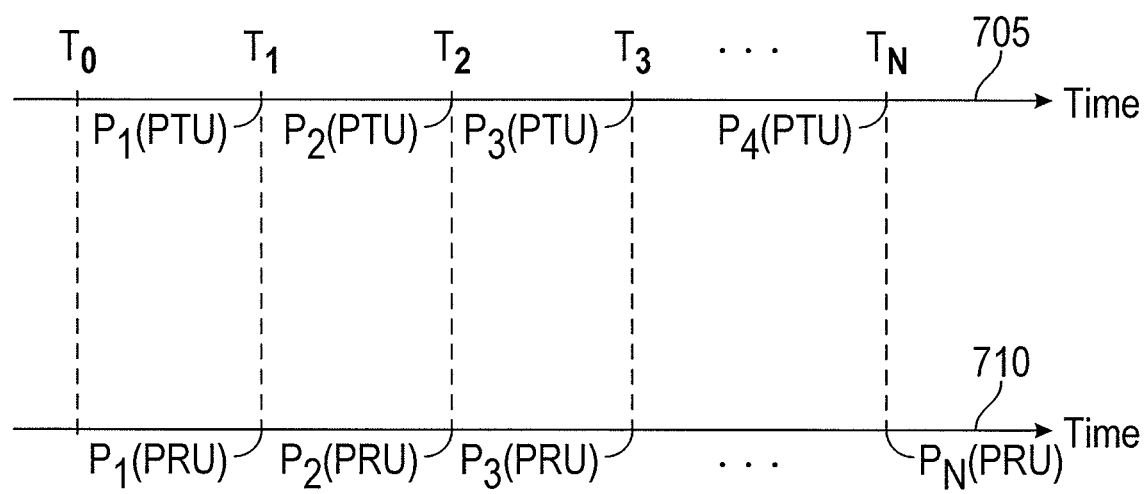
FIG. 7 illustrates a timeline of power measurements for use in determining a difference of power measurement differences determined at the transmitter of FIG. 5 and the receiver of FIG. 6.

FIG. 7 illustrates a timeline of power measurements for use in determining a difference of power measurement differences (as described in connection with FIG. 5) determined at a transmitter (e.g., the PTU 504 of FIG. 5) and a receiver (e.g., the PRU 484 of FIG. 6). A PTU timeline 705 and a PRU timeline 710 are illustrated, wherein time progresses from left-to-right. The PTU and PRU timelines 705 and 710 each include time markers (e.g., $T_0$, $T_1$, $T_2$, $T_3$, ... $T_N$, etc.), wherein N may be any positive integer and wherein N=3 only represents one example. Each of the time markers indicate sample times (e.g., the sample times described in connection with FIGS. 5-6) at which the PTU 504 and the PRU 484 may take their respective power measurements as described in regards to FIG. 5. In one embodiment, the PRU 484 may take measurements of its voltage and current levels and then provide the PTU 504 with those levels, allowing the PTU 504 to determine the PRU 484 acknowledged power levels. In another embodiment, the PRU 484 may take its own power measurements and provide them to the PTU 504. For example, the PTU 504 may take a first power measurement at the PTU 504 as indicated by $P_{1(PTU)}$ and a second power measurement at the PTU 504 as indicated by $P_{2(PTU)}$. Similarly, the PRU 484 may take a first power measurement at the PRU 484 as indicated by $P_{1(PRU)}$, etc. As indicated by the dashed-lines, the PTU 504 and the PRU 484 may take the respective power measurements for each sample time at the same time. For example, at the $T_1$ sample time, the PTU 504 may take the $P_{1(PTU)}$ power measurement at the same time that the PRU 484 takes the $P_{1(PRU)}$ power measurement.

Having taken at least two power measurements at the PTU 504 as described above, the PTU 504 may proceed to determine PTU power differences (e.g., $\Delta_{1(PTU)}$ and $\Delta_{2(PTU)}$) between two consecutive power measurements. For example, having taken power measurements at the $T_1$ and $T_2$ sample times (e.g., power measurements $P_{1(PTU)}$ and $P_{2(PTU)}$, respectively), the PTU 504 may subtract $P_{1(PTU)}$ from $P_{2(PTU)}$ to determine a first PTU power difference $\Delta_{1(PTU)}$. Then after obtaining $P_{3(PTU)}$ at the $T_3$ sample time, the PTU 504 may subtract $P_{2(PTU)}$ from $P_{3(PTU)}$ to determine a second PTU power difference $\Delta_{2(PTU)}$. The PRU 484 may also perform corresponding PRU determinations to determine corresponding PRU power differences (e.g., $\Delta_{1(PRU)}$ and $\Delta_{2(PRU)}$). The PTU 504 and the PRU 484 may proceed to determine one or more subsequent power differences (e.g., $\Delta_{N-1(PTU)}$ and $\Delta_{N-1(PRU)}$, respectively) at $T_N$ sample times based on $P_N$ and $P_{N-1}$ power measurements, wherein N may be any positive integer. These determinations may be summarized as shown in Equations (1)-(6).

$$\Delta_{1(PRU)} = P_{2(PTU)} - P_{1(PTU)} \quad (1)$$

$$\Delta_{2(PTU)} = P_{3(PTU)} - P_{2(PTU)} \quad (2)$$

$$\Delta_{N-1(PTU)} = P_{N(PTU)} - P_{N-1(PTU)} \quad (3)$$

$$\Delta_{1(PRU)} = P_{2(PRU)} - P_{1(PRU)} \quad (4)$$

$$\Delta_{2(PRU)} = P_{3(PRU)} - P_{2(PRU)} \quad (5)$$

$$\Delta_{N-1(PRU)} = P_{N(PRU)} - P_{N-1(PRU)} \quad (6)$$

After the PTU 504 has determined at least two PTU power differences (e.g., $\Delta_{1(PTU)}$ and $\Delta_{2(PRU)}$), then the PTU 504 may determine a difference of PTU power differences (e.g., a transmitter power difference, $\Delta_T$) to compare with a predetermined PTU threshold (e.g., $\text{Thresh}_{PTU}$). For example, the PTU 504 may subtract $\Delta_{1(PTU)}$ from $\Delta_{2(PTU)}$ and then compare the result with $\text{Thresh}_{PTU}$ as shown in Equation (7). If $\Delta_T$ is greater than $\text{Thresh}_{PTU}$, then the PTU 504 may request the PRU 484 to transmit its corresponding PRU power differences (e.g., $\Delta_{1(PRU)}$ and $\Delta_{2(PRU)}$) to the PTU 504 so that the PTU 504 may compare the PTU 504 and PRU 484 power differences as described below. If $\Delta_T$ is less than or equal to $\text{Thresh}_{PTU}$ (e.g., the difference of PTU power differences is small, e.g., less than a desirable threshold), then a comparison of the PTU 504 and PRU 484 power differences may result in a false positive detection of the non-compliant object 486. Thus, if $\Delta_T$ is less than or equal to $\text{Thresh}_{PTU}$, the PTU 504 may not compare the PTU 504 and PRU 484 power differences and may not request the PRU 484 to transmit its corresponding PRU power differences.

$$\Delta_T > \text{Thresh}_{PTU} \quad (7)$$

If the PTU 504 determines that the inequality in Equation (7) is true and receives the corresponding PRU 484 power differences, then the PTU 504 may compare $\Delta_T$ with a difference of the PRU power differences (e.g., $\Delta_{2(PRU)} - \Delta_{1(PRU)}$ or a receiver power difference, $\Delta_R$). In one embodiment, when the PTU 504 compares $\Delta_T$ with $\Delta_R$, the PTU 504 may determine whether $\Delta_R$ is greater than $\Delta_T$ multiplied by a proportional factor value, k, as shown in Equation (8). In another embodiment, the PTU 504 may compare $\Delta_T$ and $\Delta_R$ using a different or equivalent mathematical comparison, using a predetermined threshold, and/or with or without using a proportional factor value.

In one embodiment, if the difference between $\Delta_T$ and $\Delta_R$ in two consecutive sample times changes, the change may have been the result of any number of factors other than the presence of the non-compliant object 486. For example, if the difference between $\Delta_T$ and $\Delta_R$ in two consecutive sample times increases, the increase may be due to a dynamic load on one or more of the PRU's 484 demanding a greater or lesser amount of power, rather than due to a presence of the non-compliant object 486. For at least this reason, to further reduce the chance of false positives, the PTU 504 may take a difference between $\Delta_T$ and $\Delta_R$ in two consecutive sample times (e.g., $(\Delta_{2(PRU)} - \Delta_{1(PRU)}) - (\Delta_{2(PTU)} - \Delta_{1(PTU)})$), and then compare that result with a dynamic threshold. In one embodiment, the PTU 504 may initially set the dynamic threshold as a predetermined fixed value and then adjust the dynamic threshold based on the acknowledged power at the PRU 484 at each sample time. For example, if a dynamic load (e.g., a load demanding a variable amount of power) is detected on one or more PRU's 484, then the PTU 504 may increase the dynamic threshold. As another example, if the PTU 504 detects a measurement or sample time misalignment between the PTU 504 and the PRU 484, the PTU 504 may increase the dynamic threshold until the measurements or sample times are aligned, at which point, the PTU 504 may decrease the dynamic threshold to its original value. As another example, if difference measurements (as explained above) on the PTU 504 and the PRU 484 are averaged, then the PTU 504 may adjust the dynamic threshold accordingly to account for the averaging. As yet another example, the PTU 504 may increase the dynamic threshold if power consumption at the PRU 484 changes more than a predetermined threshold (e.g., changes from 1 W to 5 W). Alternatively, if the PRU 484 power consumption stays constant for a predetermined number of samples, the PTU 504 may decrease the dynamic threshold. For example, if the PRU 484 acknowledges 5 W for five consecutive samples, the PTU 504 may decrease the dynamic threshold.

$$\Delta_{2(PRU)} - \Delta_{1(PRU)} > k^*(\Delta_{2(PTU)} - \Delta_{1(PTU)}), \text{ where } k \text{ may be any fraction less than 1} \quad (8)$$

In one embodiment, if the inequality of Equation (8) is true and/or if the power differences exceed the dynamically adjusted threshold for a predetermined number of samples (e.g., 10 consecutive samples), then the PTU 504 may determine that the non-compliant object 486 is present. In another embodiment, the PTU 504 may instead compare a difference of single power measurements between the PTU 504 and the PRU 484 with the dynamically adjusted threshold. In another embodiment, the PTU 504 may instead compare a difference of single sample time power differences (e.g., $\Delta_{1(PTU)}$ and $\Delta_{1(PRU)}$) with the dynamically adjusted threshold. In yet another embodiment, rather than immediately determining the presence of the non-compliant object 486, the PTU 504 may first identify other possible contributors to the power inequalities, as described in connection with FIG. 8. By identifying other possible contributors to the power inequalities, the controller 515 may avoid making a false determination that the non-compliant object 486 is present. For example, one possible contributor to the power inequalities may be a change in the acknowledged power at the PRU 484 combined with a lack of synchronization (e.g., a time misalignment) between measurements taken at the PTU 504 and the PRU 484. In one embodiment, the lack of synchronization between measurements may occur due to a clock of the PTU 504 (e.g., the clock 560 of FIG. 5) being out-of-sync with a clock of the PRU 484 (e.g., the clock 660 of FIG. 6) or the sample times at the PTU 504 and the PRU 484 otherwise being out of alignment. In that case, the controller 515 may utilize a system of flag exchanges to resynchronize the clocks and/or the sample times (e.g., within some predetermined tolerance level), as further described in connection with FIG. 8.

Figure 8:
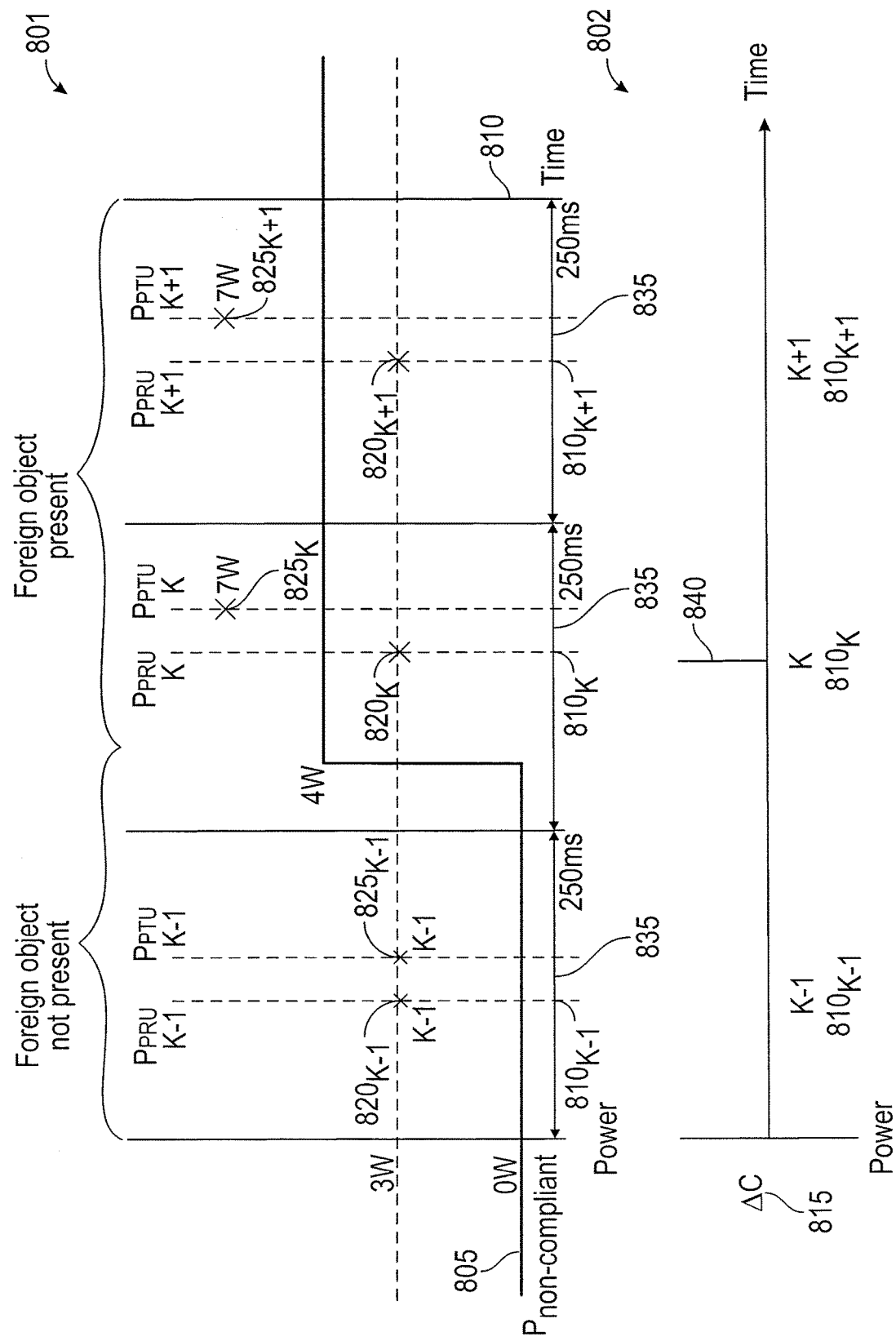
FIG. 8 illustrates two timelines that demonstrate how the power differences determined in FIG. 7 may vary based on the existence of a non-compliant object within a charging region.

FIG. 8 illustrates two timelines (a top timeline 801 and a bottom timeline 802) that demonstrate how the power differences determined in FIG. 7 may vary based on the existence of a non-compliant object (e.g., the non-compliant object 486 of FIG. 4) within, near, or around a charging region. The methods described in regards to this figure demonstrate only one example of how a PTU (e.g., the PTU 404 of FIG. 4) may determine a difference of power measurement differences between the PTU 404 and a PRU (e.g., the PRU 484 of FIG. 4). The top timeline 801 includes a y-axis indicating an amount of power (the horizontal dashed line indicating 3 W) and an x-axis indicating a progression of time from left-to right. The x-axis further including sample times 810. In this illustration, there are three sample periods 810, including sample periods $810_{K-1}$, $810_K$, and $810_{K+1}$, each of which last 250 ms. In another embodiment, each sample period 810 may last more or less time than 250 ms.

During each sample period 810, as described in connection with FIGS. 5-7, the PTU 404 may take a power measurement at the PTU 404 and the PRU 484 may take a power measurement at the PRU 484. As described above, the PRU 484 may instead measure voltage and current levels at the PRU 484 and provide the levels to the PTU 404 so that the PTU 404 may determine the PRU 484 acknowledged power levels. The vertical dashed lines on the top timeline 801 indicate times at which each of a PTU power measurement 825 and a PRU power measurement 820 take place, and their corresponding X's indicate the amount of power measured. For example, in this illustration, during the $810_K$ sample period, the PTU power measurement $825_K$ is 7 W, and the PRU power measurement $820_K$ is 3 W.

As described in connection with FIG. 7, the PTU 404 and the PRU 484 may determine a difference of their respective power measurements between consecutive sample periods 810. For example, the PTU 404 may use Equation (1) to determine $\Delta_{1(PTU)}$, where the PTU power measurement $825_K$ represents $P_{2(PTU)}$ and the PTU power measurement $825_{K-1}$ represents $P_{1(PTU)}$. Similarly, the PRU 484 may use Equation (4) to determine $\Delta_{1(PRU)}$. The PTU 404 and the PRU 484 may continue to determine their respective $\Delta_N$ values for each sample period 810. Then, depending on the results of the determinations and comparisons as described in connection with FIG. 7, the PTU 404 may proceed to use Equation (8) (or any other equivalent mathematical based comparison) to compare a difference of power measurement differences between the PTU 404 and the PRU 484, again as described in connection with FIG. 7.

A non-compliant object power line 805 indicates an amount of power that the non-compliant object 486 (not shown) may be absorbing from the PTU 404 (as described in regards to FIG. 4) at any given point along the top timeline 801. For example, during the sample period $810_{K-1}$, the non-compliant object power line 805 indicates that the non-compliant object 486 is absorbing 0 W, which may indicate that the non-compliant object 486 is not present within, near, or around the charging region. However, during the sample period $810_K$, the non-compliant object power line 805 indicates that the non-compliant object 486 is absorbing 4 W, which may indicate that the non-compliant object 486 is present within, near, or around the charging region. In another embodiment, the non-compliant object 486 may absorb more or less than 4 W of power when it is present within, near, or around the charging region.

A bottom timeline 802 includes a y-axis indicating an amount of power and also includes an x-axis indicating a progression of time from left-to-right, which corresponds with the sample periods 810 of the top timeline 801. A ΔC variable 815 indicates on the bottom timeline 802 where, and to what extent, the difference of power measurement differences (as described above and in connection with FIG. 7) exists. For example, if the PTU 404 determines that a difference of the power measurement differences increases from the previous sample period 810 (e.g., $810_{K-1}$) to the current sample period 810 (e.g., $810_K$), then the ΔC variable 815 may illustrate this with a vertical line upwards 840. If the PTU 404 determines that a difference of the power measurement differences has no change from the previous sample period 810 (e.g., $810_K$) to the current sample period 810 (e.g., $810_{K+1}$), then the ΔC variable 815 may illustrate this with no indicator. Alternatively, if the PTU 404 determines that a difference of the power measurement differences decreased from the previous sample period 810 (e.g., $810_{K-1}$) to the current sample period 810 (e.g., $810_K$), then the ΔC variable 815 may illustrate this using a vertical line downwards (not pictured). In one embodiment, the PTU 404 may use the power values of the vertical lines indicated by the ΔC variable 815 in determining an average difference of the power measurement differences, as further described below.

In the illustrated example, at sample period $810_{K-1}$, the non-compliant object 486 is absorbing 0 W (e.g., it is not present within, near, or around the charging region), and the PTU power measurement $825_{K-1}$ and the PRU power measurement $820_{K-1}$ are each 3 W. During the next sample period $810_K$, the non-compliant object 486 is absorbing 4 W (e.g., it is present within, near, or around the charging region). Correspondingly, the PTU power measurement $825_K$ is 7 W (e.g., 4 W+3 W), because the non-compliant object 486 absorbs its power from the PTU 404 coil. On the other hand, the PRU power measurement $820_K$ remains at 3 W, because its power requirements do not change with the presence of the non-compliant object 486. Therefore, according to Equations (1) and (4), the resulting $\Delta_{1(PTU)}$ is 4 W (e.g., 7 W-3 W), and the resulting $\Delta_{1(PRU)}$ is 0 W (e.g., 0 W-0 W). During the next sample period $810_{K+1}$, the non-compliant object 486 is still absorbing 4 W (e.g., it is still present within, near, or around the charging region). Correspondingly, the PTU power measurement $825_{K+1}$ is still 7 W and the PRU power measurement $820_{K+1}$ is still 3 W. Therefore, according to Equations (2) and (5), the resulting $\Delta_{2(PTU)}$ is 0 W (e.g., 7 W-7 W), and the resulting $\Delta_{2(PRU)}$ is 0 W (e.g., 0 W-0 W). Continuing with the equations as described in connection with FIG. 7, the PTU 404 may then make a comparison between the difference of the power measurement differences at the PTU 404 and the PRU 484. For example, in this case at the sample period $810_K$, $\Delta_{2(PTU)} - \Delta_{1(PTU)} = 7$ W$-3$ W$=4$ W and $\Delta_{2(PRU)} - \Delta_{1(PRU)} = 0$ W$-0$ W$=0$ W. The difference of $\Delta_{2(PTU)} - \Delta_{1(PTU)}$ (e.g., 4 W) vs. $\Delta_{2(PRU)} - \Delta_{1(PRU)}$ (e.g., 0 W) is represented by the ΔC variable 815 as the vertical line upwards 840. In one embodiment, the PTU 404 may interpret this difference as the presence of the non-compliant object 486. In another embodiment, the PTU 404 may instead compare the difference of the power measurement differences using Equation (8) (e.g., with a proportional factor value, k). In another embodiment, the PTU 404 may use this value in a difference of the power measurement differences averaging determination, as further described below. In yet another embodiment, as further described below, rather than immediately determining the presence of the non-compliant object 486, the PTU 504 may first examine other possible contributors to the power inequalities.

As mentioned above, the difference of the power measurement differences may not be due to the presence of the non-compliant object 486, if any. In one embodiment, the PTU 504 may attempt to identify other possible contributors to the power inequalities so as to avoid making a false determination that the non-compliant object 486 is present. For example, one possible contributor to the power inequalities may be a change in the acknowledged power at the PRU 484 coupled with out-of-sync power measurements at the PTU 404 and the PRU 484, as described below. As an example of a change in the acknowledged power at the PRU 484, the PRU 484 may require more or less power from the PTU 404 for performing power-intensive applications, charging or not charging, etc. As another example, the PRUs 484 may be added or removed from the vicinity of the charging region, which may also increase or decrease the acknowledged power at the PRU 484, respectively. In these cases, the results of the determinations above in regards to $\Delta_{2(PRU)}$, $\Delta_{1(PRU)}$, etc. may change, which may cause the PTU 404 to misidentify the presence of the non-compliant object 486 if the power measurements are also out-of-sync, as described below.

As mentioned, a lack of synchronization (e.g., a time misalignment) between power measurements taken at the PTU 504 and the PRU 484 may cause errors in the inequality determinations above. In one embodiment, the lack of synchronization between measurements may occur due to a clock of the PTU 504 (e.g., the clock 560 of FIG. 5) being out-of-sync with a clock of the PRU 484 (e.g., the clock 660 of FIG. 6) or the sample times at the PTU 504 and the PRU 484 otherwise being out of alignment. A measurement gap 835 indicates a difference in time between measurements taken at the PTU 404 and the PRU 484. The difference in time represented at the measurement gap 835 may be zero, because the PTU 504 and the PRU 484 may have synchronized their clocks 560 and 660 according to the flag system as further described below. Although the measurement gap 835 shows a small difference in time, the lack of synchronization does not cause any determination errors in this example, because the PRU 484 does not change its power requirements and the non-compliant object 486 does not become present during the measurement gap 835.

As mentioned above, to mitigate the determination errors caused by out-of-sync measurements at any given sample period 810, the PTU 404 may instead compare the average of the difference of the power measurement differences over several sample periods. For example, the PTU 404 may determine that the difference of the power measurement differences at the sample period $810_{K-1}$ is 0 W (as illustrated by the AC variable 815 having no indication). The PTU 404 may then determine that the difference of the power measurement differences at the sample period $810_K$ is 4 W (as illustrated by the vertical line upwards 840). The PTU 404 may then determine that the difference of the power measurement differences at the sample period $810_{K+1}$ is 0 W (as again illustrated by the ΔC variable 815 having no indication). The average of these results is $$1.33W\left(\frac{0W + 4W + 0W}{3}\right),$$

which in one embodiment, may cause the PTU 404 to determine the presence of the non-compliant object 486. In another example, the non-compliant object 486 may not be present within, near, or around the charging region at any time, but instead, out-of-sync power measurements may cause the difference of the power measurement differences to be 4 W at the sample period $810_K$. In this case, then at the third sample period $810_{K-1}$, the difference of the power measurement differences may be −4 W (as may be indicated by the vertical line downwards mentioned above). In this case, the average of the results is $$0W\left(\frac{0W + 4W + (-4W)}{3}\right),$$

which may cause the PTU 404 to determine that the non-compliant object 486 is not present. The PTU 404 may also use other averaging (e.g., a minimum value average or a moving average) or other determination variations to mitigate the determination errors caused by out-of-sync measurements and/or the PRU 484 changing its power requirements.

To further mitigate the determination errors caused by out-of-sync measurements, as mentioned above, the controller 515 may utilize a system of flag exchanges to resynchronize the clocks 560 and 660 (e.g., within some predetermined tolerance level). For example, the PTU 404 may send a "start flag" to the clocks 560 and 660 to determine a start time. The PTU 404 may then send a "stop flag" to the clocks 560 and 660 to determine a stop time. Then the PTU 404 and the PRU 484 may count a number of clock cycles between the start time and the stop time. The PTU 404 and the PRU 484 may then compare their respective number of clock cycles and resynchronize their clocks accordingly. As mentioned above, the PTU 404 and the PRU 484 may also use other methods unrelated to their clocks to resynchronize and/or align their sample times.

Figure 9:
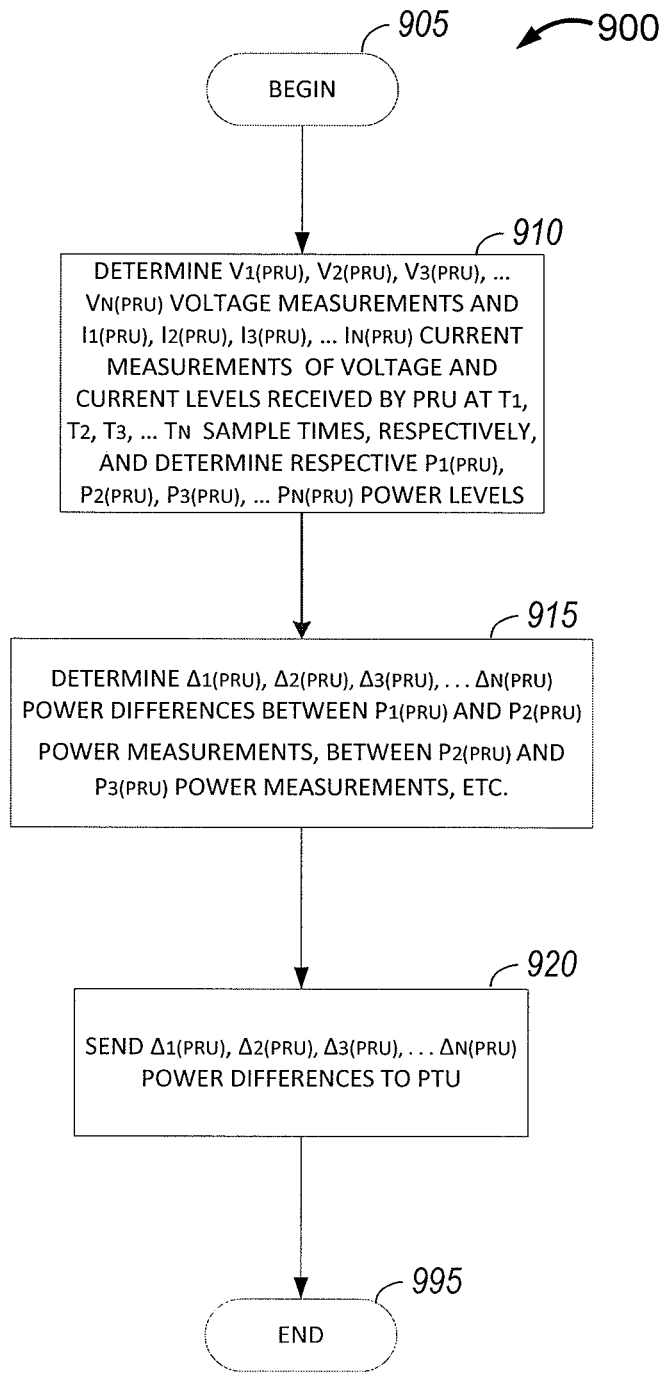
FIG. 9 illustrates a flowchart of an exemplary method for determining a difference of receiver power differences.

FIG. 9 illustrates a flowchart of an exemplary method 900 for a PRU (e.g., the PRU 484 of FIG. 6) to determine differences of its power measurements. The operations described in connection with the method 900 illustrate only one example of how the PRU 484 may determine or report its power measurements or differences thereof. In other embodiments, the PRU 484 may perform different operations as described in connection with FIGS. 5-8.

At block 905, the method begins. Then at block 910, the PRU 484 may determine voltage and current measurements (e.g., $V_{1(PRU)}$, $V_{2(PRU)}$, $V_{3(PRU)}$, $V_{N(PRU)}$ and $I_{1(PRU)}$, $I_{2(PRU)}$, $I_{3(PRU)}$, ... $I_{N(PRU)}$, respectively) of a voltage and current level, respectively, that the PRU 484 receives from a PTU (e.g., the PTU 504 of FIG. 5), as discussed in connection with FIG. 7. The PRU 484 may take the voltage and current measurements at respective sample times (e.g., $T_1$, $T_2$, $T_3$, ... $T_N$). In one embodiment, the PRU 484 may determine the sample times based on a synchronization of the PRU 484 clock 660 and the PTU 504 clock 560, which in one example, may be synchronized by utilizing a system of flag exchanges, as further described in connection with FIGS. 7-8. The PRU 484 may then determine the respective power levels ($P_{1(PRU)}$, $P_{2(PRU)}$, $P_{3(PRU)}$, ... $P_{N(PRU)}$ based on the voltage and current measurements. As discussed above, the PTU 504 may instead determine the respective power levels based on the PRU 484 voltage and current measurements.

Then at block 915, as discussed in connection with FIG. 7, the PRU 484 may determine power differences (e.g., $\Delta_{1(PRU)}$, $\Delta_{2(PRU)}$, $\Delta_{3(PRU)}$, ... $\Delta_{N(PRU)}$) between the power measurements. In the case that the PTU 504 determines the respective power levels as discussed in connection with block 910, then the PTU 504 may instead determine the power differences between the power measurements. Then at block 920, the PRU 484 may send the power differences to the PTU 504. Alternatively, in the case that the PTU 504 determines the power differences between the power measurements, then block 920 will not occur. In one embodiment, the PRU 484 may wait for the PTU 504 to request the power differences before sending them. In another embodiment, the PRU 484 may determine and send to the PTU 504 a receiver power difference (e.g., $\Delta_R$, as discussed in connection with FIG. 7). Then at block 995, the method ends.

Figure 10:
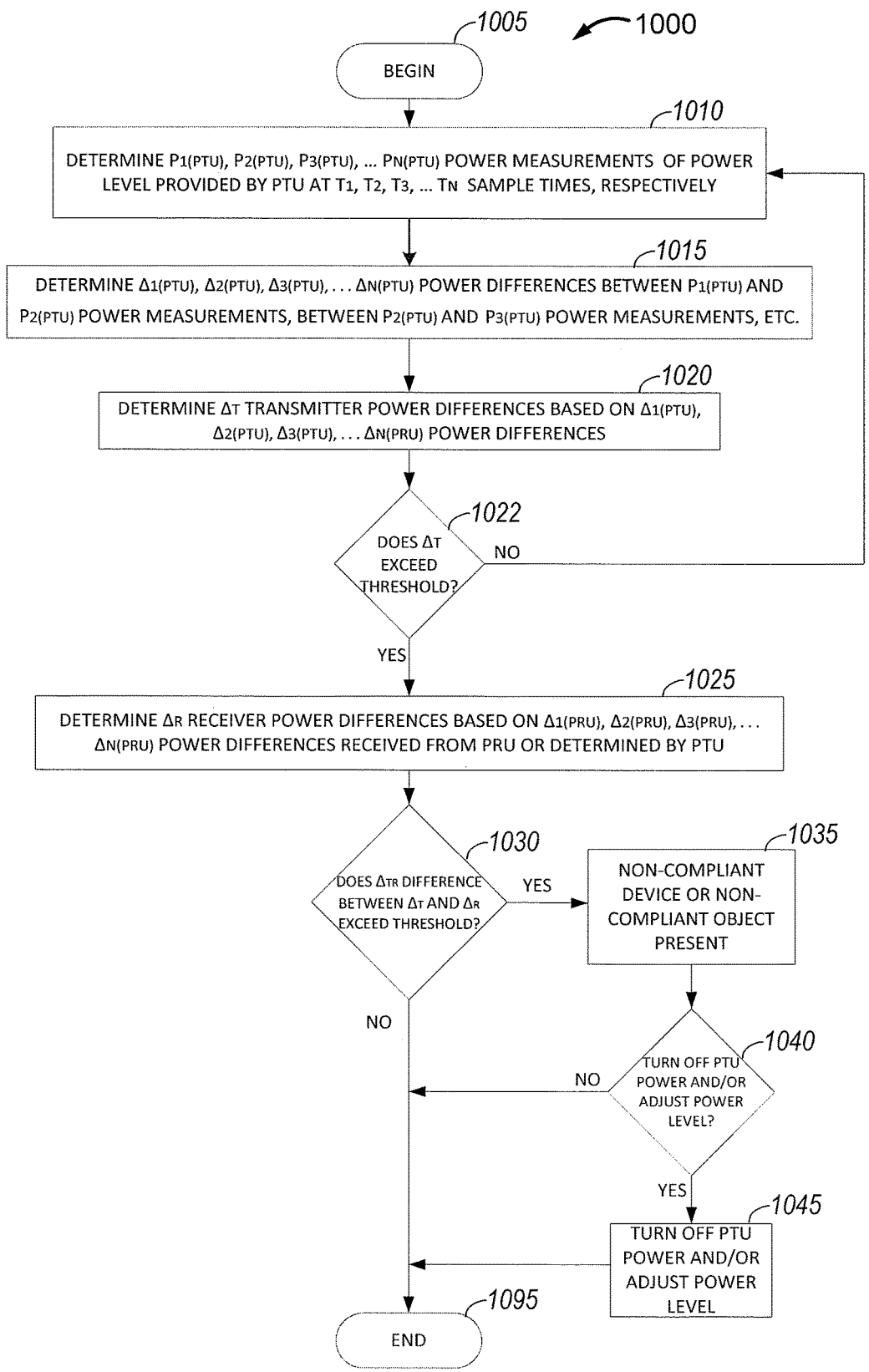
FIG. 10 illustrates a flowchart of an exemplary method for determining a difference of transmitter power differences and further determining whether a non-compliant object is present in a charging region based on the difference of transmitter power differences and the difference of receiver power differences determined at the receiver by the method of FIG. 9.

FIG. 10 illustrates a flowchart of an exemplary method 1000 for a PTU (e.g., the PTU 504 of FIG. 5) to determine differences of its power measurements and further determine whether a non-compliant object (e.g., the non-compliant object 486 of FIG. 4) is present within, near, or around a charging region based on the difference of its power measurements and a difference of receiver power differences (as discussed in connection with FIGS. 7-9). The operations described in connection with the method 1000 illustrate only one example of how the PTU 504 may determine differences of its power measurements and/or the presence of the non-compliant object 486. In other embodiments, the PTU 504 may perform different operations as described in connection with FIGS. 5-8.

At block 1005, the method begins. Then at block 1010, the PTU 504 may determine power measurements (e.g., $P_{1(PTU)}$, $P_{2(PTU)}$, $P_{3(PTU)}$, ... $P_{N(PTU)}$) of a power level that the PTU 504 provides to a PRU (e.g., the PRU 484 of FIG. 6), as discussed in connection with FIG. 7. The PTU 504 may provide the power measurements at respective sample times (e.g., $T_1$, $T_2$, $T_3$, ... $T_N$), as discussed in connection with FIG. 7.

Then at block 1015, as discussed in connection with FIG. 7, the PTU 504 may determine power differences (e.g., $\Delta_{1(PTU)}$, $\Delta_{2(PTU)}$, $\Delta_{3(PTU)}$, $\Delta_{N(PTU)}$) between the power measurements. Then at block 1020, the PTU 504 may determine a transmitter power difference (e.g., $\Delta_T$, as discussed in connection with FIG. 7) based on the power differences. Then at block 1022, the PTU 504 may compare $\Delta_T$ with a threshold, as described in connection with FIG. 7. If $\Delta_T$ does not exceed the threshold at block 1022, then the PTU 504 may return to block 1010. If it does, then the PTU 504 may proceed to block 1025.

Then at block 1025, the PTU 504 may determine a receiver power difference (e.g., $\Delta_R$, as discussed in connection with FIG. 7) based on power differences the PTU 504 receives from the PRU 484, as discussed in connection with FIGS. 7-9. As also discussed above, the PTU 504 may instead receive voltage and current measurements from the PRU 484, determine PRU 484 power measurements based on the voltage and current measurements, determine the PRU power differences ($\Delta_{1(PRU)}$, $\Delta_{2(PRU)}$, $\Delta_{3(PRU)}$, ... $\Delta_{N(PRU)}$), and then determine the receiver power difference $\Delta_R$. In one embodiment, the PTU 504 may instead receive $\Delta_R$ from the PRU 484.

Then at block 1030, the PTU 504 may determine whether a difference (e.g., $\Delta_{TR}$, as described in connection with FIG. 7) between $\Delta_T$ and $\Delta_R$ exceeds a threshold. As discussed above and in various embodiments, the PTU 504 may instead compare a difference of single power measurements between the PTU 504 and the PRU 484 with a threshold. In another embodiment, the PTU 504 may instead compare a difference of single sample time power differences (e.g., $\Delta_{1(PTU)}$ and $\Delta_{1(PRU)}$) with a threshold. In yet another embodiment, the PTU 504 may repeat steps 1010-1025 for several samples (e.g., 20), determine an average of $\Delta_{TR}$ values based on the several determined $\Delta_T$ and $\Delta_R$ values, and then compare the average of $\Delta_{TR}$ values with a threshold.

In any case, if the comparison at block 1030 does not exceed the threshold, then the method ends at block 1095. If it does, then at block 1035, the PTU 504 may determine that the non-compliant object 486 is present within, near, or around the charging region and determine whether to turn off the PTU power and/or adjust the PTU 504 power level at block 1040. If the PTU 504 determines not to turn off the PTU power or otherwise adjust the power level, then again, at block 1095, the method ends. If the PTU 504 determines to turn off the PTU power or otherwise adjust the power level, then it turns off the PTU power and/or adjusts the PTU 504 power level at block 1045, and the method ends at block 1095. In another embodiment, at block 1040, the PTU 504 may instead or additionally determine whether to change a state of transmission of power (e.g., turn on or off a beacon mode) from the PTU 504 to the PRU 484. For example, the PTU 504 may enter beacon mode, wherein the controller 515 may disable the output of the PTU 504 and/or disconnect the PTU 504 from the PRU 484.

Figure 11:
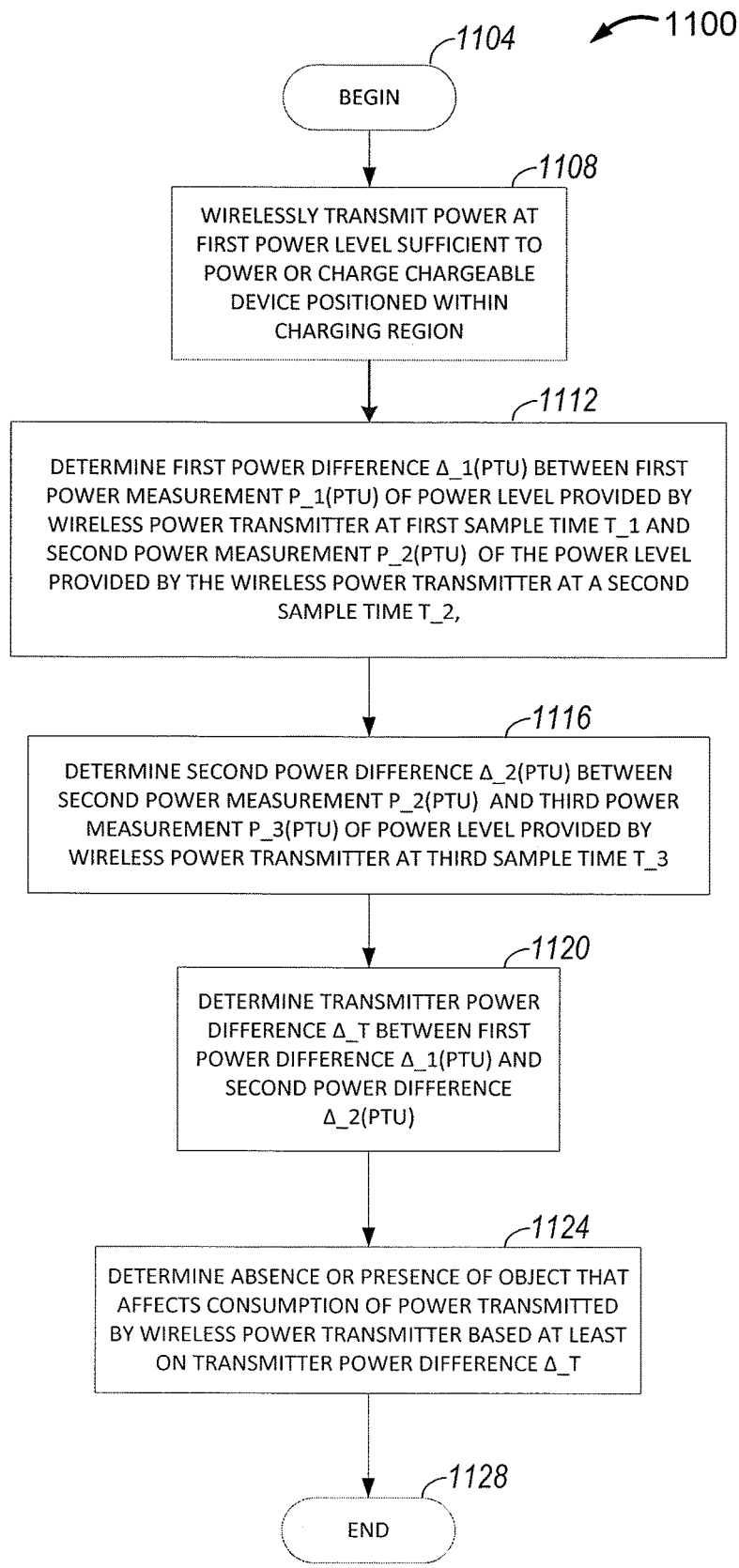
FIG. 11 is a flowchart of an exemplary method for wirelessly transferring power and determining an absence or a presence of an object.

FIG. 11 is a flowchart 1100 of an exemplary method for wirelessly transferring power and determining an absence or a presence of an object that affects consumption of power transmitted by a wireless power transmitter based at least on a transmitter power difference. At block 1104, the method begins. At block 1108, the method comprises wirelessly transmitting power at a power level sufficient to power or charge a chargeable device positioned within a charging region. At block 1112, the method comprises determining a first power difference $\Delta_{1(PTU)}$ between a first power measurement $P_{1(PTU)}$ of the power level provided by the wireless power transmitter at a first sample time $T_1$ and a second power measurement $P_{2(PTU)}$ of the power level provided by the wireless power transmitter at a second sample time $T_2$. At block 1116, the method comprises determining a second power difference $\Delta_{2(PTU)}$ between the second power measurement $P_{2(PTU)}$ and a third power measurement $P_{3(PTU)}$ of the power level provided by the wireless power transmitter at a third sample time $T_3$. At block 1120, the method comprises determining a transmitter power difference $\Delta_T$ between the first power difference $\Delta_{1(PTU)}$ and the second power difference $\Delta_{2(PTU)}$. At block 1124, the method comprises determining an absence or a presence of an object that affects consumption of power transmitted by the wireless power transmitter based at least on the transmitter power difference $\Delta_T$. At block 1128, the method ends.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations. For example, a means for wirelessly transmitting power at a power level sufficient to power or charge a chargeable device positioned within a charging region may comprise a wireless power transmitter and/or a wireless power transmitter coil. In addition, means for determining a first power difference $\Delta_{1(PTU)}$ between a first and second power measurement (e.g., $P_{1(PTU)}$ and $P_{2(PTU)}$) of the power level at a first and second sample time (e.g., $T_1$ and $T_2$) may comprise a controller circuit and/or a processor. In addition, means for determining a second power difference $\Delta_{2(PTU)}$ between $P_{2(PTU)}$ and a third power measurement $P_{3(PTU)}$ of the power level at a third sample time $T_3$ may comprise a controller circuit and/or a processor. In addition, means for determining a transmitter power difference $\Delta_T$ between $\Delta_{1(PTU)}$ and $\Delta_{2(PTU)}$ may comprise a controller circuit and/or a processor. In addition, means for determining an absence or a presence of an object that affects consumption of power transmitted by the wireless power transmitter based at least on $\Delta_T$ may comprise a controller circuit and/or a processor.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such implementation decisions may not be interpreted as causing a departure from the scope of the embodiments of the invention.

The various illustrative blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the processor such that the processor may read information from, and write information to, the storage medium. In the alternative, the storage medium may be integral to the processor. Disk and disc, as used herein, includes compact disc (CD), laser disc, optical disc, digital versatile disc (DVD), floppy disk and blu ray disc where disks usually reproduce data magnetically, while discs reproduce data optically with lasers. Combinations of the above may also be included within the scope of computer readable media. The processor and the storage medium may reside in an ASIC. The ASIC may reside in a user terminal. In the alternative, the processor and the storage medium may reside as discrete components in a user terminal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

Various modifications of the above described embodiments will be readily apparent, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus for wirelessly transferring power, the apparatus comprising:
a wireless power transmitter configured to wirelessly transmit power at a power level sufficient to power or charge a chargeable device positioned within a charging region; and
a controller circuit operationally coupled to the wireless power transmitter and configured to:
cause the wireless power transmitter to wirelessly transmit power throughout a time period to power or charge the chargeable device positioned within the charging region,
determine a first power measurement $P_{1(PTU)}$ of the power level provided by the wireless power transmitter at a first sample time $T_1$ within the time period, a second power measurement $P_{2(PTU)}$ of the power level provided by the wireless power transmitter at a second sample time $T_2$ within the time period after the first sample time $T_1$, and a third power measurement $P_{3(PTU)}$ of the power level provided by the wireless power transmitter at a third sample time $T_3$ within the time period after the second sample time $T_2$ wherein the wireless power transmitter is wirelessly transmitting power to power or charge the chargeable device as the sample times $T_1$, $T_2$ and $T_3$,
determine a first power difference $\Delta_{1(PTU)}$ between the first power measurement $P_{1(PTU)}$ and the second power measurement $P_{2(PRU)}$,
determine a second power difference $\Delta_{2(PTU)}$ between the second power measurement $P_{2(PTU)}$ and the third power measurement $P_{3(PTU)}$,
determine a transmitter power difference $\Delta\tau$ between the first power difference $\Delta_{1(PTU)}$ and the second power difference $\Delta_{2(PTU)}$, and
determine an absence or a presence of an object that affects consumption of power transmitted by the wireless power transmitter based at least on the transmitter power difference $\Delta\tau$.

2. The apparatus of claim 1, wherein the controller circuit is further configured to determine a receiver power difference $\Delta_R$ of the chargeable device, wherein the receiver power difference $\Delta_R$ is indicative of a difference between first and second power differences at the chargeable device.

3. The apparatus of claim 2, wherein the controller circuit is further configured to determine that the transmitter power difference $\Delta_T$ exceeds a threshold value before determining the receiver power difference $\Delta_R$.

4. The apparatus of claim 2, wherein the controller circuit is further configured to determine if a difference $\Delta_{TR}$ between the transmitter power difference $\Delta_T$ and the receiver power difference $\Delta_K$ exceeds a threshold value.

5. The apparatus of claim 4, wherein the controller circuit is further configured to:
determine one or more subsequent differences $\Delta_{TR\_N}$ based on one or more subsequent transmitter power differences $\Delta_{T\_N}$ and one or more subsequent receiver power differences $\Delta_{R\_N}$, wherein N is a positive integer,
determine an average of the difference $\Delta_{TR}$ and the one or more subsequent differences $\Delta_{TR\_N}$,
adjust the threshold value based at least in part on the one or more subsequent receiver power differences $\Delta_{R\_N}$, and determine if the average of the difference $\Delta_{TR}$ and the one or more subsequent differences $\Delta_{TR\_N}$ exceeds the adjusted threshold value.

6. The apparatus of claim 4, wherein the object comprises a non-compliant object and wherein the controller circuit is further configured to determine the presence of the non-compliant object if the difference $\Delta_{TR}$ exceeds the threshold value.

7. The apparatus of claim 1, wherein the wireless power transmitter turns off, adjusts the power level, or changes a state of transmission of power from the wireless power transmitter to the chargeable device if the controller circuit determines the presence of the non-compliant object within the charging region.

8. The apparatus of claim 2, wherein the controller circuit is further configured to determine if the receiver power difference $\Delta_R$ exceeds the transmitter power difference $\Delta_T$ multiplied by a proportional factor value, k, wherein k is any fraction between 0 and 1.

9. The apparatus of claim 1, wherein the power level is based on a current driven into a coil of the wireless power transmitter.

10. The apparatus of claim 1, wherein the controller circuit is further configured to synchronize a clock of the wireless power transmitter with a clock of the chargeable device or account for a time synchronization difference between one or more of the first, second, and third sample time at the wireless power transmitter, $T_1$, $T_2$, and $T_3$ and one or more of a first, second, and third sample time at the chargeable device.

11. The apparatus of claim 2, wherein the first and the second power differences at the chargeable device are based on measurements of receiver power levels, wherein the measurements of the receiver power levels and the measurements of the transmitter power levels are synchronized.

12. A method for wirelessly transferring power, the method comprising:
wirelessly transmitting power over a time period at a power level sufficient to power or charge a chargeable device positioned within a charging region;
determining a first power measurement $P_{1(PTU)}$ of the power level provided by the wireless power transmitter at a first sample time $T_1$ within the time period, a second power measurement $P_{2(PTU)}$ of the power level provided by the wireless power transmitter at a second sample time $T_2$ within the time period after the first sample time $T_1$, and a third power measurement $P_{3(PTU)}$ of the power level provided by the wireless power transmitter at a third sample time $T_3$ within the time period after the second sample time $T_2$ wherein the wireless power transmitter is wirelessly transmitting power to power or charge the chargeable device as the sample times $T_1$, $T_2$ and $T_3$,
determining a first power difference $\Delta_{1(PTU)}$ between the first power measurement $P_{1(PTU)}$ and the second power measurement $P_{2(PTU)}$,
determining a second power difference $\Delta_{2(PTU)}$ between the second power measurement $P_{2(PTU)}$ and the third power measurement $P_{3(PTU)}$,
determining a transmitter power difference $\Delta\tau$ between the first power difference $\Delta_{1(PTU)}$ and the second power difference $\Delta_{2(PTU)}$, and
determining an absence or a presence of an object that affects consumption of power transmitted by the wireless power transmitter based at least on the transmitter power difference $\Delta\tau$.

13. The method of claim 12, further comprising determining a receiver power difference $\Delta_R$ of the chargeable device, wherein the receiver power difference $\Delta_R$ is indicative of a difference between first and second power differences at the chargeable device.

14. The method of claim 13, further comprising determining that the transmitter power difference $\Delta_T$ exceeds a threshold value before determining the receiver power difference $\Delta_R$.

15. The method of claim 13, further comprising determining if a difference $\Delta_{TR}$ between the transmitter power difference $\Delta_T$ and the receiver power difference $\Delta_R$ exceeds a threshold value.

16. The method of claim 15, wherein the object comprises a non-compliant object, and the method further comprising determining the presence of the non-compliant object if the difference $\Delta_{TR}$ exceeds the threshold value.

17. The method of claim 12, wherein the power level is based on a current driven into a coil of the wireless power transmitter.

18. The method of claim 13, wherein the first and the second power differences at the chargeable device are based on measurements of receiver power levels, wherein the measurements of the receiver power levels and the measurements of the transmitter power levels are synchronized.

19. An apparatus for wirelessly transferring power, the apparatus comprising:
means for wirelessly transmitting power over a time period at a power level sufficient to power or charge a chargeable device positioned within a charging region;
means for determining a first power measurement $P_{1(PTU)}$ of the power level provided by the wireless power transmitter at a first sample time $T_1$ within the time period, a second power measurement $P_{2(PTU)}$ of the power level provided by the wireless power transmitter at a second sample time $T_2$ within the time period after the first sample time $T_1$, and a third power measurement $P_{3(PTU)}$ of the power level provided by the wireless power transmitter at a third sample time $T_3$ within the time period after the second sample time $T_2$ wherein the wireless power transmitter is wirelessly transmitting power to power or charge the chargeable device as the sample times $T_1$, $T_2$ and $T_3$,
means for determining a first power difference $\Delta_{1(PTU)}$ between the first power measurement $P_{1(PTU)}$ and the second power measurement $P_{2(PTU)}$,
means for determining a second power difference $\Delta_{2(PTU)}$ between the second power measurement $P_{2(PTU)}$ and the third power measurement $P_{3(PTU)}$,
means for determining a transmitter power difference $\Delta\tau$ between the first power difference $\Delta_{1(PTU)}$ and the second power difference $\Delta_{2(PTU)}$, and
means for determining an absence or a presence of an object that affects consumption of power transmitted by the transmitting means based at least on the transmitter power difference $\Delta\tau$.

20. The apparatus of claim 19, wherein the power level is based on a current driven into the transmitting means.

21. The apparatus of claim 19, further comprising means for determining a receiver power difference $\Delta_R$ of the chargeable device, wherein the receiver power difference $\Delta_R$ is indicative of a difference between first and second power differences at the chargeable device.

22. The apparatus of claim 21, further comprising means for determining if a difference $\Delta_{TR}$ between the transmitter power difference and the receiver power difference $\Delta_R$ exceeds a threshold value.

23. The apparatus of claim 21, wherein the first and the second power differences at the chargeable device are based on measurements of receiver power levels, wherein the measurements of the receiver power levels and the measurements of the transmitter power levels are synchronized.

\* \* \* \* \*

UNITED STATES PATENT AND TRADEMARK OFFICE
CERTIFICATE OF CORRECTION

PATENT NO. : 9,793,717 B2  
APPLICATION NO. : 14/335655  
DATED : October 17, 2017  
INVENTOR(S) : Mark David White, II Page 1 of 1

It is certified that error appears in the above-identified patent and that said Letters Patent is hereby corrected as shown below:

In the Specification

In Column 14 at Line 63 (approx.), Change "$\Delta_{1(PRU)}$" to --$\Delta_{1(PTU)}$--.

In Column 15 at Line 7, Change "$\Delta_{2(PRU)})$," to --$\Delta_{2(PTU)})$,--.

In Column 19 at Line 52 (approx.), Change "$810_{K-1}$," to --$810_{K+1}$,--.

In Column 20 at Line 26, Change "$V_{3(PRU)}$, $V_{N(PRU)}$" to --$V_{3(PRU)}$, . . . $V_{N(PRU)}$--.

In Column 20 at Line 38, Change "$P_{N(PRU)}$" to --$P_{N(PRU)})$--.

In Column 21 at Line 17 (approx.), Change "$\Delta_{3(PTU)}$, $\Delta_{N(PTU)})$" to --$\Delta_{3(PTU)}$, . . . $\Delta_{N(PTU)})$--.

In the Claims

In Column 24 at Line 33, In Claim 1, change "$P_{2(PRU)}$," to --$P_{2(PTU)}$,--.

In Column 24 at Line 56, In Claim 4, change "$\Delta_K$" to --$\Delta_R$--.

In Column 26 at Line 66, In Claim 22, after "difference" insert --$\Delta_T$--.

Signed and Sealed this  
Thirteenth Day of March, 2018

Andrei Iancu  
*Director of the United States Patent and Trademark Office*